United States Patent [19]
Niori et al.

[11] Patent Number: 5,800,618
[45] Date of Patent: Sep. 1, 1998

[54] PLASMA-GENERATING ELECTRODE DEVICE, AN ELECTRODE-EMBEDDED ARTICLE, AND A METHOD OF MANUFACTURING THEREOF

[75] Inventors: Yusuke Niori, Inuyama; Koichi Umemoto, Toyota; Ryusuke Ushikoshi, Tajimi, all of Japan

[73] Assignee: NGK Insulators, Ltd., Japan

[21] Appl. No.: 491,999

[22] PCT Filed: Jun. 30, 1994

[86] PCT No.: PCT/JP94/01063

§ 371 Date: Jul. 18, 1995

§ 102(e) Date: Jul. 18, 1995

[87] PCT Pub. No.: WO95/14308

PCT Pub. Date: May 26, 1995

[30] Foreign Application Priority Data

Nov. 12, 1992 [JP] Japan ................... 4-302351
Nov. 18, 1993 [JP] Japan ................... 5-289290
Mar. 29, 1994 [JP] Japan ................... 6-059077

[51] Int. Cl.[6] ............... H01L 21/00; C23C 16/50
[52] U.S. Cl. ............................. 118/723 E; 118/725
[58] Field of Search ................... 118/725, 723 ER, 118/723 E, 723 MP, 723 MW; 156/345; 219/385

[56] References Cited

U.S. PATENT DOCUMENTS

| | | | |
|---|---|---|---|
| 4,451,349 | 5/1984 | Yeh | 204/298 |
| 5,079,031 | 1/1992 | Yamazaki et al. | 427/38 |
| 5,231,690 | 7/1993 | Soma et al. | 392/416 |
| 5,280,156 | 1/1994 | Niori et al. | 219/385 |
| 5,382,311 | 1/1995 | Ishikawa et al. | 156/345 |
| 5,432,315 | 7/1995 | Kaji et al. | 219/121.43 |
| 5,456,757 | 10/1995 | Aruga et al. | 118/723 E |
| 5,460,684 | 10/1995 | Saeki et al. | 156/345 |

FOREIGN PATENT DOCUMENTS

| | | | |
|---|---|---|---|
| 0 506 391 A1 | 9/1992 | European Pat. Off. | 21/68 |
| 61-171128 | 8/1986 | Japan | H01L 21/302 |
| 1-200625 | 8/1989 | Japan | H01L 21/302 |
| 2-35438 | 3/1990 | Japan . | |
| 3-194948 | 8/1991 | Japan | H01L 21/68 |
| 3-255625 | 11/1991 | Japan | H01L 21/302 |
| 3-255626 | 11/1991 | Japan | H01L 21/302 |
| 4-34953 | 2/1992 | Japan | H01L 21/68 |
| 4-304941 | 10/1992 | Japan . | |

*Primary Examiner*—Jey Tsai
*Attorney, Agent, or Firm*—Parkhurst & Wendel

[57] ABSTRACT

A plasma generating electrode device including a substrate 31 made of a dense ceramic, and an electrode 55 buried in said substrate 31, wherein said electrode 55 is isolated from a setting face of said substrate 31, and plasma is generated over said substrate. It is preferable that the minimum thickness of an electromagnetic wave permeation layer 37 is not less than 0.1 mm, the average thickness of the electromagnetic wave permeation layer is not less than 0.5 mm, the electrode 55 is a planar electrode made of a metal bulk, and the electrode is a monolithic sinter free from a joint face. This structure can be applied to an electric dust collector, an electromagnetic shield device or an electrostatic chuck. These can be preferably installed inside a semiconductor production unit using a halogen-based corrosive gas. The electrode can be embedded in the dense substrate made of the joint face-free monolithic sinter by hot press sintering a ceramic molding and the electrode made of the planar metal bulk under pressure applied in a thickness direction of the electrode.

28 Claims, 10 Drawing Sheets

FIG_3
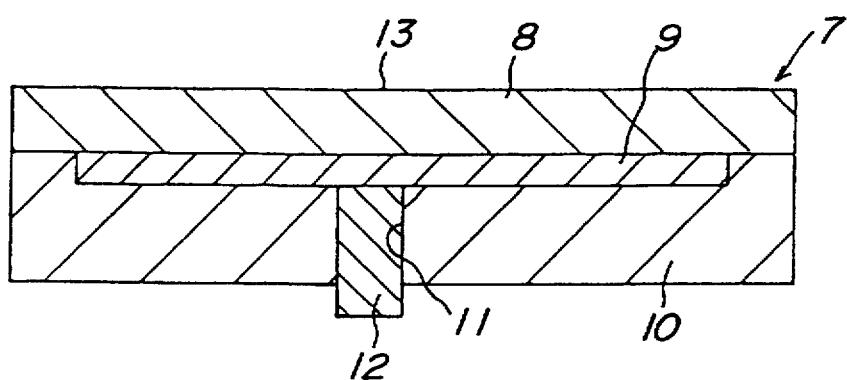

FIG_4
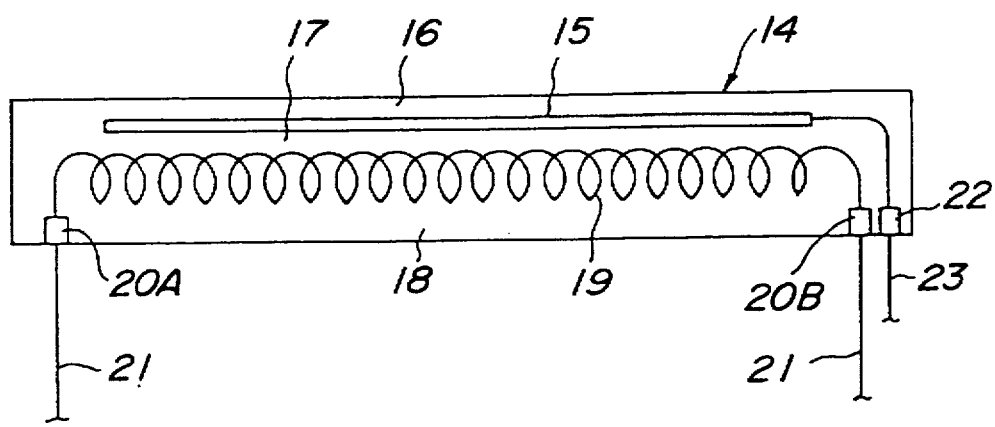
FIG_5
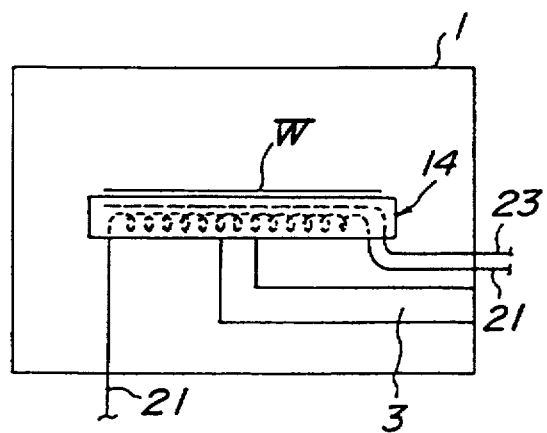

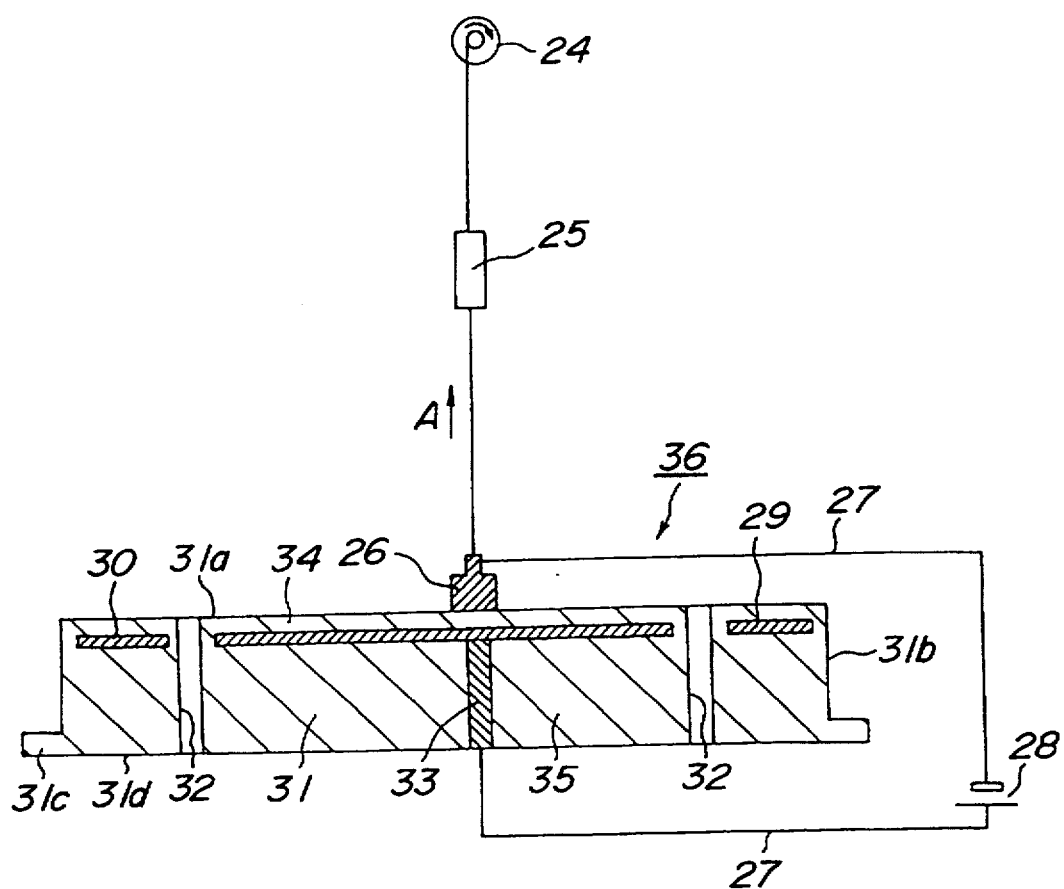

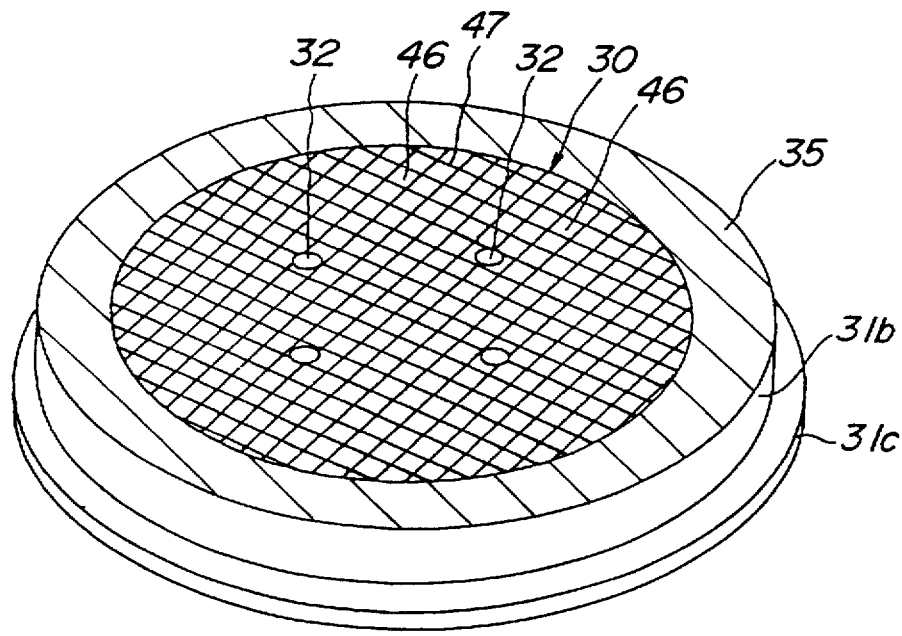
FIG_8
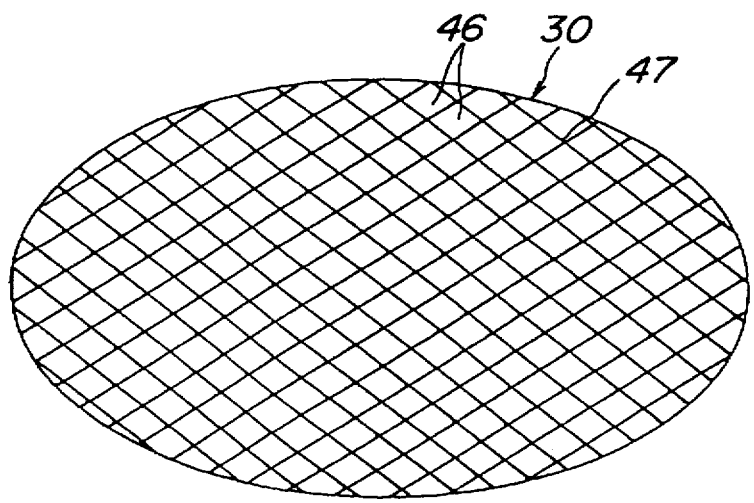
FIG_9

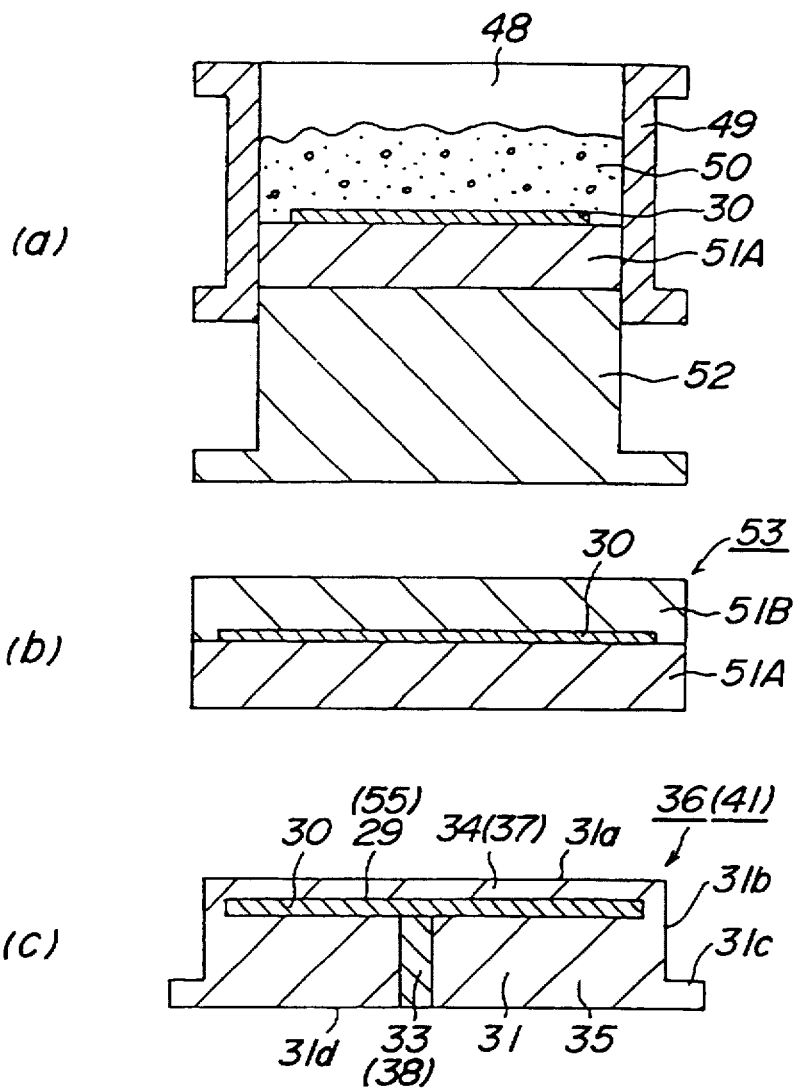
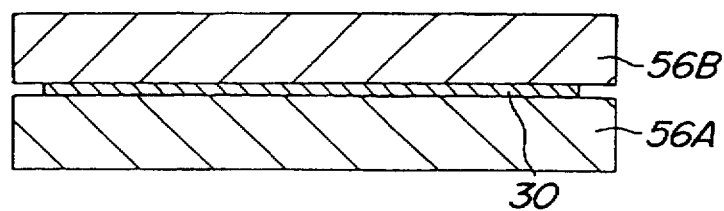

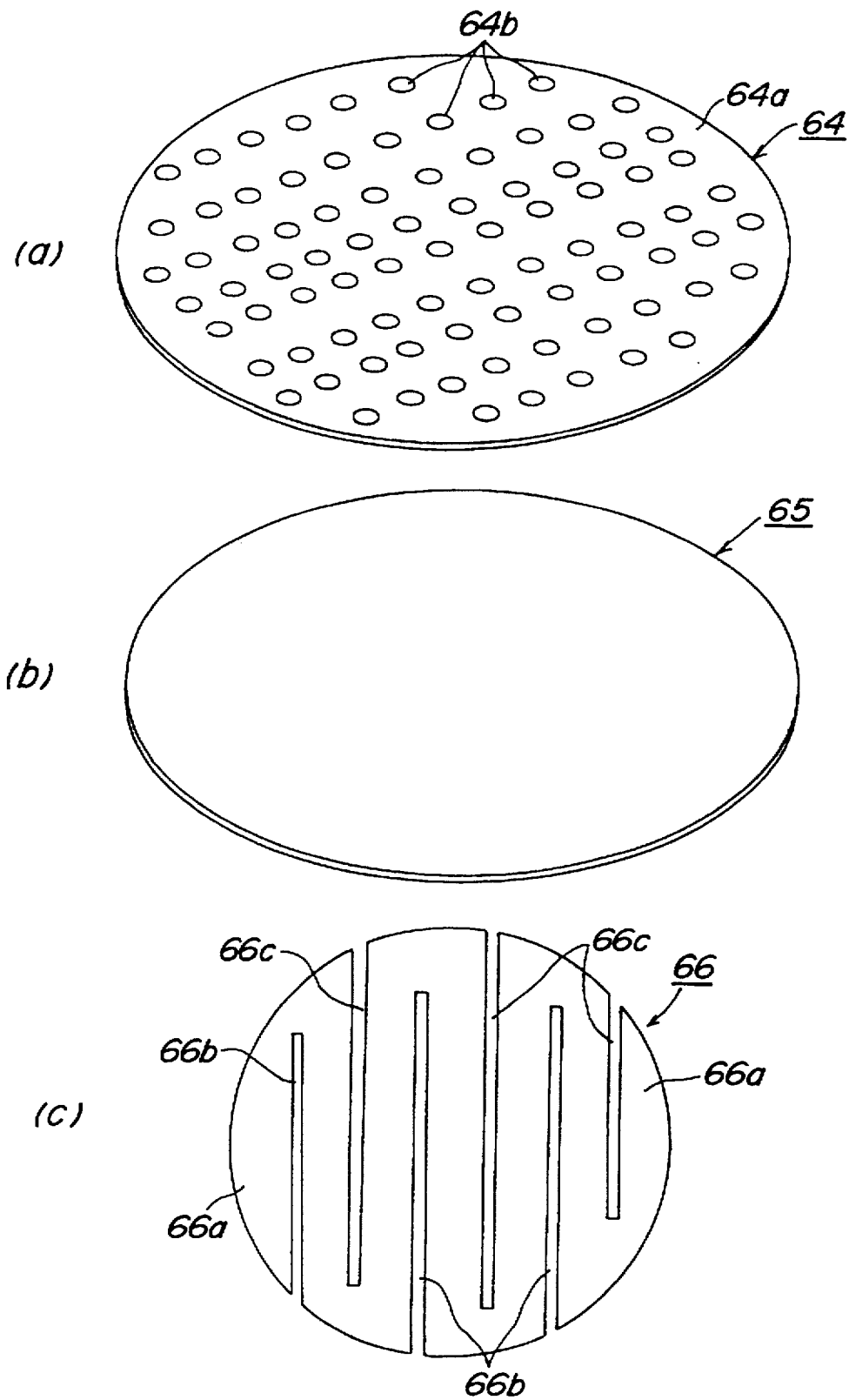

PLASMA-GENERATING ELECTRODE DEVICE, AN ELECTRODE-EMBEDDED ARTICLE, AND A METHOD OF MANUFACTURING THEREOF

TECHNICAL FIELD

The present invention relates to an electrode-embedded article such as a plasma-generating electrode device usable for semiconductors, or the like, a method of manufacturing such an electrode-embedded article, and an electromagnetic wave permeation body to be preferably used in such electrode-embedded articles.

BACKGROUND OF THE INVENTION

For semiconductor device production units requiring super-clean conditions, corrosive gases such as chlorine based gas, fluorine based gas and the like are used as a depositing gas, an etching gas, and a cleaning gas. Therefore, if a conventional heater wherein the surface of a resistance heating element is covered with a metal, such as stainless steel or Inconel, is used as a heater to heat wafers which are exposed to the corrosive gas, unfavorable minute chloride, oxide, fluoride, and other particles with diameters of a few μm are formed due to the exposure of that metal to the corrosive gas.

In view of this, with those etchers and CVD units running at low temperatures, as illustrated in FIG. 1, by way of example, an arrangement used to be adopted, wherein infrared lamps 5 are installed outside a chamber 1 via a quartz window 4, the chamber interior being exposed to deposition-gas, etc.; a susceptor 2 made of aluminum for example is installed within the chamber 1 through an arm 3; and the susceptor 2 is heated by the infrared lamps 5, whereby a wafer W placed on the susceptor 2 is indirectly heated. In this arrangement, the metal susceptor 2 is used as an electrode for plasma generation, plasma is generated within the chamber 1 with high-frequency electric energy fed directly to susceptor 2 so as to form a semi-conductor film on the wafer W and clean it. In this case, the aluminum susceptor 2 has an insulating film of alumina with a thickness of approximately 10 μm formed over its surface through an anodized aluminum production process so that wafer W was placed on this insulating film might be prevented from against directly receiving high-frequency electric energy. High-frequency electric energy discharging takes place with this insulating film maintained charged at a certain level within the plasma, since no charges flow to either one electrode, unlike current discharging.

However, in the above-mentioned conventional case the susceptor 2 was made of a metal, and therefore wafers were unfavorably contaminated with heavy metal. Particularly, the aluminum susceptor 2 was confronted with a problem of Mg-contamination. To solve the problem of such contamination, it has been proposed that susceptor 2 be insulating and a plate-like electrode 6 be attached to the rear face of the susceptor for plasma generation, as illustrated in FIG. 2 by way of example. Regrettably however, a further problem occurred wherein the plate-like electrode 6 for high-frequency electric energy supply intercepted infrared rays from infrared lamps 5, and the heating capacity of the susceptor 2 further declined. In addition, with said susceptor, the point of plasma generation deviated from the set position of the wafer W, whereby preferable plasma generation was generated, resulting in decreasing wafer cleanability. The susceptor with a ring-like electrode fitted around the outer periphery thereof also caused a similar problem.

Although said insulating film remains charged at a certain level in the stage of plasma generation for such processes as physical vapor deposition (PVD process), chemical vapor deposition (CVD process) or in an etching unit, electrolytically dissociated ions and electrons collide against the charged insulating film to damage said insulating film. Particularly, the anodized aluminum insulating film lacking denseness and having a thickness of approximately 10 μm at most gave a short service life. Especially with the CVD process unit, an etching unit and the like using halogen-based corrosive gas, the anodized aluminum insulating film having such short service life requires frequent replacement. It was discovered that particularly the metals such as aluminum, etc. had undergone heavy corrosion by the plasma of the halogen-based corrosive gas, whereby the susceptors of these metals went through serious deformation to such an extent that the susceptors failed to provide normal service.

The inventors discovered the following problem referred to hereunder in the course of investigations. Namely, in such a process using plasma as referred to above, the molecules of the gas are first dissociated to release highly reactive positive ions and electrons and thereby generate a plasma zone. Since the electrons which electrolytically dissociated at that time each have a smaller mass, they move more rapidly as compared with ions, resulting in producing a region with a smaller electron density near a high-frequency electrode. This region with the smaller electron density is called a plasma sheath. Utilizing the potential of the plasma sheath, the ions within the plasma are accelerated, and the accelerated ions are brought into collision against the wafer surface. Ions of different species are selectively applied respectively for etching, CVD and PVD.

But, in the case with the susceptor of anodized aluminum applied as referred to above, the plasma sheath did not grow stably, sometimes failing to assure stabilized plasma discharge. As a consequence, there sometimes occurred failure of effecting stabilized etching, CVD and PVD over the entire surface areas of the susceptor.

In the semiconductor device production units, an electrostatic chuck is now used for the purpose of the transfer, the exposure to light, film formation, micro-processing, cleaning, dicing, and so on for the wafers. The following are known as an electrostatic chuck:

(1) An electrostatic chuck which is obtained through screen-printing a filmy electrode on a disk-like ceramic green sheet, placing another disk-like ceramic green sheet on the resultant to cover the screen-printed filmy electrode, followed by press-molding, and sintering the resulting ceramic green sheet assembly. Pressing the ceramic green sheet molding inevitably causes non-uniform pressurization, whereby the thickness of a dielectric layer of the electrostatic chuck becomes non-uniform, thus resulting in not only rendering difficult the manufacture of such chucks, but also reducing the yield of production thereof.

(2) To solve this problem, the present inventors developed electrostatic chuck 7, schematically illustrated in FIG. 3. That is, a disk-like dielectric plate 8 of dense and insulating ceramic and a disk-like support 10 of insulating ceramic are prepared. The disk-like support 10 has a through hole 11. Further, a circular sheet of a conductive bonding agent and a columnar terminal 12 are prepared. The circular sheet is held between the disk-like support 10 and the back side of the dielectric plate 8. The columnar terminal 12 is put into through hole 11. In this state, the resulting assembly is thermally treated and thereafter, the dielectric plate 8 and the disk-like support 10 are bonded together, using the conductive bonding agent layer 9. Then, the dielectric plate 8 is polished to flatten a wafer-attracting surface 13.

It is however noted that in the process of (1), the thickness of the dielectric layer is likely to become irregular due to certain restrictions in the production. In this regard, a complementary description is made hereunder. In the method in which the respective green sheets are laminated one upon another after providing the print electrode on one of the green sheets, press-molded and fired, there inevitably is non-uniform thickness of the dielectric layer and poor adhesion of the assembly components at the respective stages of the press-molding and the firing. Namely, these problems coincide with the displacement of the print electrode inside the sintered assembly. In view of this, it is difficult to make uniform the thickness of the dielectric layer no matter how fine the surface of the dielectric layer is planed after the monolithical sintering. In the sintering process under normal pressure, as the assembly size goes up, it is difficult to secure the denseness of the dielectric layer at 100%, and from the standpoint of preventing dielectric breakdown, this sintering process deteriorates its reliability. Moreover, since the electrode is formed by the screen printing process, the electric resistance thereof is relatively large. Accordingly, it is difficult to increase the rise speed for actuating the electrostatic chuck.

Meanwhile, in the process of (2), the disk-like support 10 and the dielectric plate 8 are molded, sintered, and mechanically surface-polished. Particularly with the dielectric plate, it is necessary to plane it to make uniform the thickness. Further, it is required to bond together the disk-like support and the dielectric plate through heating with the circular sheet of silver solder or the like sandwiched therebetween. Therefore, it is necessary to implement the grinding of the disk-like support 10 and the dielectric plate 8, the thickness adjustment thereof, and very troublesome silver-soldering to join together said support 10 and said dielectric plate 8, thus resulting in increasing the number of processing steps, and thereby interfering with efficient mass production. Joining together the disk-like support 10 and the dielectric plate 8 using a conductive bonding agent such as silver solder or the like leaves behind a joint face along the conductive bonding agent layer 9. However, this joint face gives rise to a factor for the dielectric breakdown under high vacuum condition. Further, with regard to these electrostatic chucks, high-frequency wave generating electrodes, etc., it has been clarified that the following problem occurred. Namely, with semiconductor device production units, such a method is generally put into practice, which comprises the steps of supplying a gas into the unit and applying high-frequency electric power to the gas for the plasma generation. Therefore, said high-frequency wave generating electrodes, and ECR units are finding wide use with the semiconductor device production units for dry etching, chemical vapor-phase growth process, and the like.

Where the ECR unit is employed, the electric power in the form of the high-frequency waves in the microwave band is applied to the gas, whereby ECR locally generates plasma within the high-frequency electric field and also within the static magnetic field with a spatially irregular intensity distribution. Subsequently, a force is applied to the plasma in a certain direction to accelerate the plasma. In the ECR unit, a 2.45 GHz is generally employed as the microwaves. The microwaves are radiated, through an electromagnetic wave permeation window, into the ERC unit, so that plasma is generated in the gas molecules.

As this electromagnetic wave permeation window is exposed to the microwaves having high energy, it is essential for this window to at least release heat due to its heat loss. It is also necessary for the window to have excellent thermal shock resistance so that the window may be difficult to be cracked if it is heated. To meet these requirements, the electromagnetic wave permeation window used to be fabricated of silica glass in the past.

However, the electromagnetic wave permeation windows of silica glass have to date incurred damage by ECR plasma, loss in electromagnetic wave permeability, and breakage. These problems stemmed from the damages of said windows by the plasma.

The inventors attempted to fabricate the electromagnetic wave permeation window of alumina or sapphire, and found that these materials suffered greater dielectric loss compared with quartz, and that the transmission of a microwaves through the alumina or sapphire window entailed a local rise in temperature exceeding 200° C. Generally, it is observed that exposing the electromagnetic wave permeation window to microwaves gives rise to the generation of heat therein due to the inner friction of molecules or polar groups within the dielectric material. Quantity Q of the heat generated is expressed by $Q = kfE^2 \epsilon \tan \delta$. In this expression, k is a constant, f a frequency, E an electric field, and $\epsilon$ a dielectric constant. It was further clarified that as the alumina or sapphire electromagnetic wave permeation window locally underwent intensive heating, such windows of a large diameter over 100 mm failed to resist the thermal impact, and were broken.

DISCLOSURE OF THE INVENTION

It is an object of the present invention to provide a plasma generating electrode device which can stably generate plasma near a wafer.

It is another object of the present invention to provide a plasma generating electrode device with sufficient corrosion resistance against generated plasma.

A further object of the present invention is to stably generate a plasma sheath to stabilize plasma discharge so that processings such as etching, CVD, PVD, or the like may be effected stably over the entire surface area of a susceptor.

A still further object of the present invention is not only to improve the reliability of an electrode-embedded article such as a plasma generating electrode device, or the like with a view to preventing dielectric breakdown and short circuiting, but also to decrease the resistance of the electrode.

A still further object of the present invention is to provide a producing process which lessens the number of steps in producing an electrode-embedded article such as the plasma generating electrode device, or the like and in particular the complicated step of silver-soldering, or the like being eliminated, whereby the process is suitable for mass production.

A still further object of the present invention is to provide an electromagnetic wave permeation body for use with the plasma generating electrode device, which electromagnetic wave permeation body is resistant to not only damage even upon exposure to plasma but also breakdown even when the temperature rises with an electromagnetic wave passing through the transmission body.

The plasma generating electrode device according to the present invention is characterized in that said device comprises a plasma generating electrode embedded in a dense ceramic substrate, and said plasma generating electrode has an insulating property against the wafer-setting surface of the substrate.

The plasma generating electrode device according to the present invention is characterized in that said device comprises a dense ceramic substrate and an electrode embedded therein; said device is so designed as to generate plasma over the substrate and the thickness of an electromagnetic wave permeation layer lying between the electrode and the substrate surface over which plasma is generated is not less than 0.1 mm at the minimum.

An opposite electrode is arranged approximately parallel to the electrode in the substrate of the plasma generating electrode device of the present invention, whereby high-frequency electric power can be supplied therebetween. In this case, it may be that high-frequency electric power is supplied to the electrode in the substrate with the opposite electrode grounded and vice versa.

The electrode-embedded article according to the present invention is characterized in that said electrode unit comprises a dense ceramic substrate and an electrode of a planar metal bulk embedded in the substrate, and the substrate enclosing the electrode is a joint face-free monolithic sinter.

The method of manufacturing the electrode-embedded article according to the present invention is characterized in that a ceramic molding and an electrode comprising a planar metal bulk are hot press-sintered with pressure being applied in a thickness direction of the electrode, whereby the electrode is embedded in a joint face-free monolithic dense substrate sinter.

Further, the present invention relates to an electromagnetic wave permeation body for use with the plasma generating electrode device to generate plasma with high-frequency electric power applied to the gas, wherein at least that surface of said electromagnetic wave permeation body contacting the atmosphere of plasma being generated, is comprised of aluminum nitride of which dielectric loss tan $\delta = 10^{-2}$ at 25° C. and whose thermal shock resistance $\Delta Tc$ is not less than 300° C. Since the plasma generating electrode device according to the present invention has a plasma generating electrode embedded in the dense ceramic substrate, a wafer, or the like can be set directly on the substrate with no fear of contamination, and the point where plasma is generated is near the wafer, whereby both plasma generating conditions and plasma cleaning performance can be improved.

The inventors made further studies in this regard. Namely, as in the foregoing, the inventors have examined the reason why a plasma sheath was not stably produced over the surface of the anodized aluminum electrode. According to present theory, it must be that if the surface of the electrode is covered with an insulating material, and the surface of the insulating material gets a negative potential, the plasma sheath region grows and the plasma sheath gets stabilized. However, it was clarified that where thin film was an anodized aluminum as referred to above, the electrode failed to keep its surface at a negative potential of a sufficiently large magnitude and uniformity when heated to a high temperature, so that a uniform and sufficiently stabilized plasma sheath could not be produced.

Meanwhile, it was thought in the past that increasing the thickness of the insulating film would accordingly expand the distance between the plasma region and the electrode, make insufficient the acceleration of ions within the plasma atmosphere, and impart the stability of plasma discharge.

But, when the electrode was embedded in a dense ceramic substrate and the minimum thickness of the electromagnetic wave permeation layer was increased to not less than 0.1 mm, the plasma sheath region expanded and the plasma generated was uniformly and stably produced. It was also found that even when the thickness of the electromagnetic wave permeation layer was increased, the dielectric factor of the electromagnetic wave permeation layer was large by a few to several times as much as that of a vacuum, since that layer comprised ceramic. As a consequence, it was confirmed that there was no fall in the intensity of the electric field between the electrode, and those ions within the plasma could be accelerated sufficiently in the plasma sheath, resulting in stabilizing plasma discharge.

According to the present invention, the electrode is embedded in the dense ceramic substrate, and the minimum thickness of the electromagnetic wave permeation layer lying between the electrode and the surface of the substrate over which plasma is generated is not less than 0.1 mm, whereby the plasma is assured of stability against ion bombardment.

In order to embed the electrode in the dense ceramic substrate, a ceramic producing step, as will be mentioned later, must be implemented. The electrode, which has gone through the above ceramic producing step undergoes some undulation in its profile. As a result, the thickness of the electromagnetic wave permeation layer between the electrode and the surface of the substrate changed depending on where the electrode was embedded flat. The magnitude of this change depends upon the accuracy of the production, and upon the materials, etc. in the case of the ordinary producing process. The change in the thickness of the electromagnetic wave permeation layer reaches as much as 0.7 mm at the maximum. Since the thickness fluctuation of the electromagnetic wave permeation layer depends on the plane location where the electrode is, it is necessary that the minimum thickness of the electromagnetic wave permeation layer be set at not less than 0.1 mm.

The inventors further proceeded with the investigation of the construction of the plasma generating electrode device. As a result, it was found that, with the electrode-embedded article according to the present invention, as the embedded plane electrode comprises a metal bulk, the electrode exhibits a small resistance. In this regard, a supplementary account is give hereunder. Namely, since a screen print electrode has a thickness of approximately some ten µm at most, the resistance inevitably increases.

Besides, since the substrate enclosing the electrode is a joint face-free monolithic sinter, discharge and dielectric breakdown do not occur from the joint face even under the condition of high vacuum or the like in which discharge likely occurs. As a consequence, the reliability of the electrode-embedded article is remarkably improved.

Further, the electrode-embedded article according to the present invention can be produced by hot press-sintering the ceramic molding with the planar electrode of a metal bulk embedded therein, while applying pressure to the molding in the thickness direction of the electrode. In addition, this process has a lesser number of the producing steps, and is devoid of a bonding step using silver solder or the like, so that the process is suited for mass production.

The inventors further investigated the cause of damage to the electromagnetic wave permeation quartz window in the ECR plasma unit. As a result, the inventors came to reach the following conclusion. Namely, since the plasma generating reaction is a vigorous reaction, it is very difficult to control the characteristics of the plasma with various external parameters. Besides, since the ECR plasma has greatly intensive energy, component members exposed to the ECR plasma are liable to incur changes in quality. Particularly with the ECR plasma unit, the plasma-generating position is controlled with the magnetic field. However, since the magnetic field is spatially non-uniform, the plasma intensity is greatly fluctuated locally.

As a result, it is considered that the plasma ion bombardment against the electromagnetic wave permeation window will heat the surface of the window at a high temperature, and a silica glass window may sometimes undergo local melting. Such a phenomenon was likewise observed in the respective cases where a non-corrosive gas such as argon, nitrogen, oxygen, $SiH_4$ or the like was used.

Meanwhile, since the electromagnetic wave permeation window is exposed to the microwaves, a dielectric loss generates heat. In this way, the electromagnetic wave permeation window incurs two different kinds of thermal stresses, one stemming from a plasma thermal input to the window and another resulting from self heat generation with the microwaves. Further, it was found that in the case where halogen-based non-corrosive gas such as $ClF_3$, $NF_3$, $CF_4$, $CHF_3$, $SiH_2Cl_2$ or the like was used, the surface of the electromagnetic wave permeation window surface reacted with the halogen, and was etched, in addition to melting at the above high temperature.

The inventors attempted to produce the electro-magnetic wave permeation window, using aluminum nitride exhibiting said property. As a result, it was discovered that the electromagnetic wave permeation window was hardly melted or broken owing to the above heat generation, and that the window scarcely underwent etching, with the halogen-based corrosive gas. In addition, it was likewise ascertained that aluminum nitride with said property has great thermal shock resistance, the electromagnetic wave permeation window was not broken even when the window temperature went up locally with the microwaves passing therethrough. The present invention was completed based on the above.

Particularly, the wafers for use in the production of DRAMs increase their diameters. With this taken into account, it is necessary to increase the diameters of the electromagnetic wave permeation windows. In this case, the electromagnetic wave permeation window could be stably used by employing aluminum nitride as its material.

Thermal shock resistance ΔTc is defined as follows: For the test, a JIS test piece having the dimensions of 3 mm×4 mm×40 mm is used. This test piece is brought into an electric furnace in which the test piece is held for 10 minutes at an optional temperature. Thereafter, the test piece is put into water at a temperature of 26° C. in an amount of 10 liters to cool it quickly. Afterward, the 4-point bending strength of the test piece is measured at room temperature. As a result, the 4-point bending strength of the test piece declines via a certain temperature difference as a border. Here, this temperature difference (maximum temperature difference within which the 4-point bending strength does not fall) as the border is taken as ΔTc.

Aluminum nitride is known a corrosion resistant ceramic. It must be understood, however, that the corrosion resistance of this ceramic represents the ion reactivity with acid and alkaline solutions. Meanwhile, the present invention is concerned not with the ion reactivity but with the local heat generation due to the bombardment of plasma ions. The present invention likewise is directed to the reactivity of halogen corrosive gases with plasma.

Examining a damaged electromagnetic wave permeation window of sapphire revealed that the source of damage was located at the window surface which had been exposed to the bombardment with plasma irons. Therefore, it suffices if at least that surface part of the electromagnetic wave permeation window which is exposed to plasma is made of aluminum nitride having excellent thermal shock resistance and excellent corrosion resistance.

The electrode-embedded article according to the present invention is preferred as an electric dust collector, an electromagnetic shield, a high-frequency electrode, and an electrostatic chuck. Particularly where the electrode-embedded article is fabricated as a high-frequency electrode for example, comprising tungsten, and the frequency is 13.56 MHz, the thickness of the electrode is preferably not less than 430 μm. However, it is difficult to form the electrode in the thickness specified above by using the screen printing process. Further, when the electrode-embedded article is applied as an electrostatic chuck or an electric dust collector, the response speed in chucking and dust collecting can be increased by making the electrode from the planar metal bulk.

In case where the electrode-embedded article is installed in a semiconductor device production unit using the halogen-based corrosive gas, said electrode-embedded article provide the following function. That is, in the electrostatic chuck as illustrated in FIG. 3, it was sometimes observed that the filmy electrode 9 underwent corrosion with the halogen-based corrosive gas. Further, since the filmy electrode 9 was fabricated of a heavy metal-containing solder, it was feared that the semiconductors would suffer contamination with a heavy metal.

However, according to the present invention, since the substrate enclosing the electrode is a joint face-free monolithic sinter, the corrosion of the electrode and the contamination inside the semiconductor device production unit can be prevented. Those electrode-embedded articles installed inside the semiconductor device production units using the halogen-based corrosive gas includes the electrostatic chuck and the high-frequency electrode.

Nitride-based ceramics such as silicon nitride, aluminum nitride, boron nitride, SIARON, etc., silicon carbide, and an alumina-silicon carbide complex compound are ceramics desired to fabricate the substrate for the electrode-embedded article of the present invention. Through the investigation the inventors revealed that from the viewpoint of thermal shock resistance, silicon nitride is most preferred, and also that from the standpoint of corrosion resistance, aluminum nitride is most preferable.

However, aluminum nitride is particularly hard to be sintered. Therefore, it is difficult to provide a sinter with relatively high density by the conventional sintering process under normal pressure. Thus in the past, to promote the sintering of aluminum nitride, a large quantity of a sintering aid used to be included in aluminum nitride powder. However, such sintering aid becomes an impurity when the electrode-embedded article is put particularly within the semiconductor device production unit. This may cause contamination of the semiconductor. In the process of producing the electrode-embedded article according to the present invention, since the substrate with remarkably high relative density of more than 99% can be produced by hot-press sintering the aluminum nitride powder, even where the content of impurities involved in the aluminum nitride powder is less than 1%. Dense aluminum nitride ceramic with a relative density of over 99%, which is produced by sintering under normal pressure, hot press-sintering or the thermal CVD process, is desired.

In case where the electrode-embedded article according to the present invention is used as an electrostatic chuck and where the electrostatic chuck is used within the semiconductor device production unit, the following problem occurs. Since ceramics have such a characteristic that their volume resistivities decline as the temperature rises, the current flowing a semiconductor wafer attracted on the substrate increases with rise in temperature, whereby the wafer may be damaged. Therefore, it is desired that the volume resistivity of the substrate be not less than $10^{11}$ $\Omega$cm. In this regard, it is also desired that the substrate shows a volume resistivity not less than $10^{11}$ $\Omega$cm even in a high temperature range of, for example, 500°–600° C. when the substrate is used at high temperatures not less than 600° C. To meet this requirement, alumina, beryllia, magnesia, silicon nitride, and boron nitride are preferred.

In the process of producing the electrode-embedded article according to the present invention, a planar electrode comprising a metal bulk is embedded in a ceramic molding. For this steps, the following methods may be recited by way of example.

Method (1): A pre-molded substrate is prepared, and said electrode is set thereon. Thereafter, ceramic powder is filled up on the pre-molded substrate and electrode, followed by uniaxial pressing.

Method (2): Two planar molding are prepared through cold isostatic pressing and an electrode is held between these two planar moldings. Thereafter, said two moldings and the electrode are hot-pressed. In this method, the molding prepared via cold isostatic pressing exhibits a higher density already at this stage and a lesser fluctuation in density inside the molding, compared with Method (1). Accordingly, compared with the Method (1), Method (2) gives a smaller shrinkage of the molding during hot press, and the lesser fluctuation after the sintering. Accordingly the mean dielectric strength of the substrate increases relatively.

The above-quoted functions and effects come to carry great significance when the electrode-embedded article is applied as an electrostatic chuck. This is because due to the above reasons, the mean dielectric strength of a dielectric layer of the electrostatic chuck can be further increased, and the reliability thereof can be remarkably improved.

In this sense, it is most desired that the relative density of the molding obtained by the cold isostatic pressing be not less than 60%.

In case where the electrode is screen-printed on the surface of a molding formed by the cold isostatic pressing, the print electrode is required to be degreased for a long time within a non-oxidizing atmosphere after the screen-printing. Therefore, the method wherein the electrode is held between a pair of the moldings prepared by way of the cold isostatic pressing, is devoid of such a degreasing step for a long time, and therefore, is advantageous from the standpoint of mass production.

Further, assuming that the electrode film has been formed by the screen printing where the electrode-embedded article is applied as an electrostatic chuck, it is considered that the electrode film is deformed during the hot press, whereby the thickness of the dielectric layer lying on the electrode film becomes non-uniform. Meanwhile, the electrode comprising a planar metal bulk is embedded as in the present invention, when the electrode is prevented from being deformed when hot-pressed, since the electrode has rigidity. Thus, the non-uniform thickness of the dielectric layer can be prevented.

Particularly when the electrode-embedded article is an electrostatic chuck, the chucking performance depends on the thickness of this dielectric layer. Thus, the thickness of the dielectric layer is important. The planar metal bulk in the present invention refers to a monolithic planar configuration as shown in FIGS. 9 and 13 by way of example, without a wire or strip being arranged in a spiral or zigzag form.

In the process of producing the electrode-embedded article of the present invention, the electrode is hot-pressed in the thickness direction thereof. Therefore, in order to prevent the electrode from suffering strain during hot pressing, the electrode is preferable of a flat plate configuration. In the case where the electrode is used where the temperature rises at not less than 600° C. at the maximum, it is desired that such an electrode be made of a metal with a high melting point. The electrostatic chuck is recited as such an application.

As such metals showing high melting points, tantalum, tungsten, molybdenum, platinum, rhenium, hafnium, and alloys of these metals may be recited. From the standpoint of preventing the contamination of the semiconductors, tantalum, tungsten, molybdenum, platinum, and the alloys thereof are preferable.

When the electrode is of tungsten and the substrate of silicon nitride, the coefficient of thermal expansion largely differs between them. Therefore, owing to mismatch between them in the thermal expansion, the integration thereof was difficult by the conventional process in which the electrode film is prepared by screen printing, followed by sintering under normal pressure. Meanwhile, in the producing process according to the present invention, the electrode and the substrate can be united even if the coefficient of thermal expansion largely differs between the electrode and the substrate. This is because the substrate molding is hot-pressed in the thickness direction of electrode.

The electrode involves a planar electrode made of a plate with numerous small holes in addition to a planar electrode comprising a thin plate. In case where the electrode is of a plate-like member with numerous small holes, since ceramic powder flows into these numerous small holes and reaches the rear side, the adhesion force of ceramic on both sides of the plate-like member increases to enhance the mechanical strength of the substrate.

As such a plate-like member, a punched metal and a metal screen may be recited. In the case where the electrode is of a high melting point metal as punched, it is difficult to punch a large number of small holes in the high melting point metal, because such a metal has high hardness. Thus, the production cost remarkably goes up.

Meanwhile, when the electrode is of a metal mesh, it is easy to procure wires having a high melting point. Therefore, the metal mesh can be produced by braiding such wires so that the electrode can be easily produced.

When such an electrode comprises a thin plate, it is observed that the difference, in coefficient of thermal expansion between the electrode and substrate causes large stress to be applied at a peripheral part of the electrode, whereby the substrate sometimes suffers damage due to this stress. But, when the electrode is of the plate-like member having numerous small holes, these small holes disperse the stress.

In the electrode-embedded article of the present invention, no particular restriction is imposed on the mesh pattern of the metal screen and the diameter of the wire. However, the wire diameter of 0.03 mm and the mesh size of 150 through the wire diameter 0.5 mm and the mesh size 6 gave rise to no problem in use. The sidewise cross sections of the wire making up the metal screen may be of various rolled profiles such as circular, elliptical or rectangular.

With the plasma generating electrode device of the present invention, for the above reasons taken with the thickness fluctuation of the electromagnetic wave permeation layer, it is desired that the average thickness thereof be not less than 0.5 mm.

In case with the plasma generating electrode device of the present invention, the dielectric constant of the electromagnetic wave permeation layer is generally large. However, the excess average thickness of the electromagnetic wave permeation layer coincides with the increased quantity of self heat generation due to the loss of the dielectric layer of the electromagnetic wave permeation layer. Consequently, the efficiency of plasma energy tends to decrease. From this viewpoint, it is particularly desired that the average thickness of the electromagnetic wave permeation layer be not more than 5.0 mm.

In case where the plasma generating electrode device of the present invention is used in a semi-conductor device production unit with use of the halogen-based corrosive gas so as to generate plasma by applying high-frequency electric power to the halogen-based corrosive gas, a reaction product is formed on the surface of the electromagnetic wave permeation layer due to the bombardment with ions of the halogen-based corrosive gas. As the thickness of this reaction product layer reaches a few µm to some tens µm, the minimum thickness of the electromagnetic wave permeation layer needs to be not less than 0.1 mm, and also that the average thickness thereof is preferably not less than 0.5 mm so that sufficient insulating property may be maintained.

Where the electromagnetic wave permeation layer is formed, using aluminum nitride with a relative density of not less than 99% in the plasma generating electrode device of the present invention, an $AlF_3$ passivation layer is formed as a reaction product layer. Since the $AlF_3$ passivation layer has a corrosion resistive action, corrosion can be prevented from propagating inwardly beyond this layer.

Particularly when the plasma generating electrode device is used in semiconductor device production units, it is essential to prevent the semiconductors from undergoing contamination with a metal. With an increased densification progress, the demands calling for the elimination of the metal have recently increased. Taking into account such demands, it is desired that the content of impurities in aluminum nitride be restricted to below 15%.

With the plasma generating electrode device of the present invention, it is desired that the electrode be a bulk-like planar electrode, and that the substrate enclosing the planar electrode be a joint face-free monolithic sinter. The planar metal bulk refers to a monolithic planar mold, without a wire or a strip being arranged in a spiral or zigzag form. This will be further explained.

According to the method in which the plasma generating electrode device is produced by forming a print electrode on a ceramic green sheet, laminating another green sheet on the former, and press molding and firing the laminate, the print electrode is displaced at a press-molding stage or a firing stage. The result is that the electromagnetic wave permeation layer is liable to undergo fluctuation in its thickness, no matter how fine the surface of the dielectric layer is planed. Moreover, according to the sintering process under normal pressure, it is difficult to secure the dielectric layer at 100% denseness particularly when the size of the plasma generating electrode device increases. Consequently, reliability falls from the standpoint of preventing the dielectric breakdown. On the other hand, the size of semiconductor wafers has been increasing. For sufficient permeability of high-frequent waves, it is necessary to reduce the reactance component of the plasma generating electrode device, and it is likewise required to suppress the electrode resistance below 1Ω. For this purpose, the electrode thickness needs to be increased sufficiently. But, this is difficult for the print electrode.

If an embedded planar electrode is made of a metal bulk, it is easy to reduce the resistance of the electrode. The screen print electrode has a thickness of some tens µm at the maximum, and therefore, the resistance thereof inevitably increases. In case where the electrode is made of tungsten and the frequency is 13.56 MHz, it is desired that the electrode thickness be not less than 20 µm. However, it is difficult to form the electrode of such a thickness by the screen printing process.

Besides, since the substrate enclosing the electrode is a joint face-free monolithic sinter, electric discharge and dielectric breakdown occur from such a joint face under the condition such as vacuum in which discharge is likely to occur. As a result, the plasma generating electrode device has its reliability remarkably improved.

Where the plasma generating electrode device is installed in a semiconductor device production unit using a halogen-based corrosive gas, the high-frequency electrode is liable to be corroded with the halogen-based corrosive gas. Further, since the high-frequency electrode is made of a metal-contained solder, it is feared that the semiconductor may undergo contamination with a solder metal. In this case, however, if the substrate enclosing the electrode is made up in the form of a joint face-free monolithic sinter, corrosion of the electrode and the contamination inside the semiconductor device production unit can be prevented.

As the ceramics constituting the substrates, nitride-based ceramics such as silicon nitride, aluminum nitride, boron nitride, and SIARON, and alumina-silicon carbide composite material are preferred. According to the inventors' investigation, from the viewpoint of thermal shock resistance, silicon nitride is particularly preferred, while aluminum nitride is preferred from the corrosion resistance against the halogen-based corrosive gas.

The plasma generating electrode device of the present invention can be produced by the afore-mentioned Method (1) or (2).

When used in condition that the temperature rises particularly at high temperatures less than 600° C., the high-frequency electrode of the plasma generating electrode device of the present invention is preferably made of a metal of a high melting point. As such a high melting point metal, tantalum, tungsten, molybdenum, platinum, rhenium, hafnium, and the alloys thereof may be used. When the plasma generating electrode device is installed within the semiconductor device production unit, tantalum, tungsten, molybdenum, platinum, and the alloys thereof are preferred from the standpoint of preventing contamination of the semiconductor.

With the plasma generating electrode device of the present invention, the electrode includes a planar electrode composed of a thin plate and a planar electrode made of a plate with numerous small holes. When the electrode is the planar type electrode with numerous small holes, ceramic powder flows into these small holes, and moves to the rear face. Consequently, the substrate has its mechanical strength increased on opposite sides of the planar member.

As the plate-like members, a punched metal and a metal screen may be recited. In case that the electrode is made of the high melting point metal as punched, it is difficult to punch a large number of small holes in the high melting point metal, because the metal is very hard. Consequently, the production cost remarkably goes up.

Meanwhile, when the electrode is a metal electrode, it is easy to procure wires made of a high melting point, so that the mesh electrode can be easily produced by braiding the wires. Thus, the electrode can be easily produced.

When the electrode is of a thin plate, a particularly large stress occurs in the peripheral edge portion of the electrode due to difference in coefficient of thermal expansion between the electrode and the substrate, so that the substrate sometimes is damaged by this stress. However, when the electrode is of a planar member having a number of small holes, the above stress is dispersed by these numerous small holes. In addition, when the electrode is a mesh electrode, the mesh electrode is formed by the wires and the section of the wires is circular. Thus, the effect of dispersing the stress becomes greater.

No particular limitation is posed upon the mesh shape, the wire diameter, etc. of the mesh electrode. However, it is preferable that the wire width of the mesh electrode is not more than 0.8 mm and that not less than 8 wires cross per inch. That is, if the wire width is more than 0.8 mm, the electric field intensity distribution in the plasma-generating space defined by the opposite electrodes is disturbed so that the plasma distribution may be likely to be deteriorated. Further, when the plasma generating electrode unit is used for a long time, the stress field formed by the wires present as a foreign matter in the ceramic exceeds the strength of the ceramic, the ceramic tends to be broken. Furthermore, if the number of the crossing wires per one inch is less than 8, current is unlikely to uniformly flow the entire mesh electrode. From the standpoint of the practical production, it is preferable that the wire width of the mesh electrode is not less than 1 mm and the number of the crossing wires per one inch is not more than 100.

The widthwise cross sectional shape of the wires constituting the mesh electrode may be of a circular shape or any of various rolled shapes such as an elliptical shape and rectangular shape.

In the plasma generating electrode unit according to the present invention, heat may be generated at that surface of the substrate on the plasma generating side by embedding the resistance heat generator made of a high melting point metal in the substrate and feeding electric power to the resistance heat generator. By so doing, the wafer can be directly heated in the state that the wafer is placed and held directly on the plasma generating electrode unit. Thus, response at the time of uniform heating and heating can be improved. In the plasma generating electrode unit, at least the electromagnetic wave permeation layer in the substrate may be formed of aluminum nitride having the dielectric loss tan δ of not more than $10^{-2}$ and the thermal shock resistance ΔTc of not less than 250° C.

The function and the effects of aluminum nitride constituting the electromagnetic wave permeation layer are the same as those of the above-mentioned electromagnetic wave permeation body.

BRIEF DESCRIPTION OF THE DRAWINGS

FIG. 3 is a cross sectional view for outlining one example of a conventional electrostatic chuck;

FIG. 4 is a schematic view for schematically illustrating how a resistance heating element is embedded in the substrate of the plasma generating electrode device according to the present invention;

FIG. 5 is a schematic view for schematically illustrating the construction of one embodiment of the heating unit incorporating the plasma generating electrode device 14 with a heater shown in FIG. 4;

FIG. 6 is a cross sectional view for outlining an electrostatic chuck as an electrode-embedded article, and an mechanism for measuring the force of attraction of the chuck;

FIG. 8 is a perspective view for illustrating the electrostatic chuck in FIG. 6 or the plasma generating electrode device 41 with a part thereof being cut away;

FIG. 9 is a perspective view for illustrating a mesh electrode or mesh 30 usable as a high-frequency electrode or an electrostatic chuck electrode;

FIG. 10(a) is a schematic cross sectional view for illustrating the molding step in uniaxial press mold, FIG. 10(b) a cross section view of a molding 53, and FIG. 10(c) a cross section view for outlining a main part of electrostatic chuck 36 or a plasma generating electrode device 41;

FIG. 11 is a cross sectional view of a molding prepared by the cold isostatic pressing process;

FIG. 12(a) is a perspective view of a punched metal 64 to be used as a high-frequency electrode or an electrostatic chuck, FIG. 12(b) is a perspective view of a circular thin plate 65 usable as a high-frequency electrode or an electrostatic chuck, and FIG. 12(c) is a plan view of a thin plate 66 to be used as a high-frequency electrode or an electrostatic chuck;

BEST MODE OF PERFORMING THE INVENTION

Figure 1:
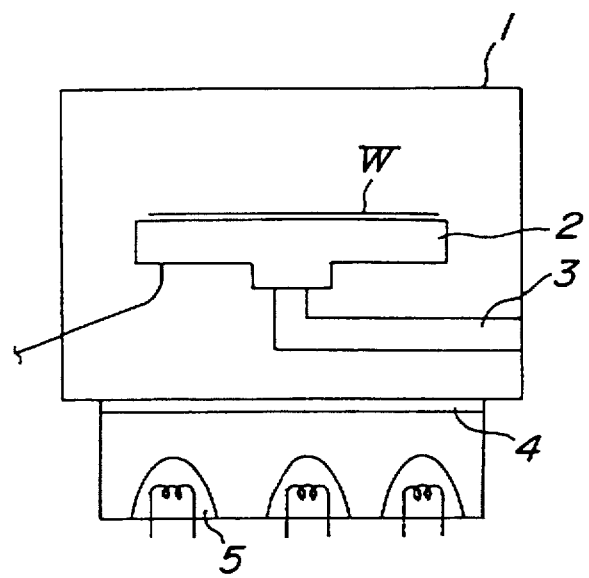
FIG. 1 is a view illustrating the construction of one example of a conventional heating unit.
Figure 2:
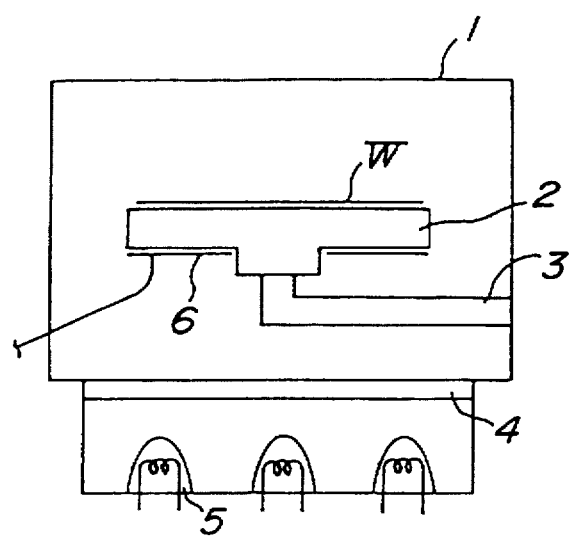
FIG. 2 is a view illustrating the construction of another example of the conventional heating unit.

FIG. 4 is a schematic view for illustrating the structure of the heater-equipped plasma generation electrode unit 14 according to the present invention. According to the embodiment illustrated in FIG. 4, a resistance heat generating body 19 made of a high melting point metal such as W or Mo is embedded inside a ceramic substrate 18 having, for example, a discoidal shape. This heat generating body 19 is preferably spirally coiled, and arranged in a swirling form when the discoidal ceramic substrate 18 is viewed in plane. At opposite ends of the resistance heat generating body 19 are provided terminals 20A, 20B for the supply of electric power, to which electric cables 21 are continued. Inside the ceramic substrate 18 above the resistance heat generating body 19 is provided a discoidal plasma generating electrode 15 having a diameter slightly smaller than the ceramic substrate 18. To the plasma generating electrode 15 is provided a terminal 22 and a succeeding cable 23 for the supply of high frequency electric power. Only a necessary set of such terminals 22 and succeeding cables 23 (one set in this embodiment) are provided depending upon high frequency signals to be supplied.

Since the ceramic substrate 18 is heated at 600° C. to 1100° C. at the maximum in, for example, a hot CVD unit, the substrate is preferably made of alumina, a silicon nitride sinter, sialon, silicon carbide, aluminum nitride, or an alumina-silicon carbide composite material from the standpoint of heat resistance. Particularly, the ceramic substrate 18 is preferably made of non-oxide type ceramic. This is because the non-oxide type covalent ceramic such as SiC, $Si_3N_4$ or AlN generates a smaller amount of a gas under high vacuum as compared with oxide type ceramics such as alumina. Among them, silicon nitride is preferred, because when silicon nitride is used, the strength of the entire plasma generating electrode unit 14 becomes higher, its coefficient of thermal expansion is almost equal to that of silicon as a typical material for wafers, and silicon nitride has high durability against the corrosive gas.

In order to embed a plasma electrode in the ceramic substrate 18, the substrate 18 is constituted by an electromagnetic wave permeation layer or a filmy substrate 16 and a planar substrate 17. The components 16, 17 may be made of the same material or different kinds of materials. In order to avoid an effect upon a semiconductor device due to current flowing a wafer, the electromagnetic wave permeation layer 16 preferably has a volume resistivity of not less than $10^8$ Ωcm and a thickness of not less than 10 μm. The filmy substrate 16 is placed in the plasma sheath, and undergoes ion bombardment with molecules activated upon application of bias voltage to the electrode 15. For this reason, ion bombardment resistance is required for the electromagnetic wave permeation layer 16, so that its thickness is preferably set at not less than 100 μm. However, as the electromagnetic wave permeation layer 16 becomes thicker, dielectric loss occurs upon application of the high frequency power. Consequently, the loss of high frequency power increases, and the efficiency of the high frequency power decreases. Accordingly, the thickness of the electromagnetic wave permeation layer 16 is preferably not more than 1 mm. Further, the electromagnetic wave permeation layer 16 and the substrate 17 are monolithically molded. Alternatively, the layer 16 and the substrate 17 may be joined with borosilicate glass or oxynitride glass as an insulating joining material. A reactance component of the electrode 15 needs to be decreased so as to assure sufficient transmission of high frequency waves, and the electrode 15 needs to have a sufficient thickness to present not more than 1Ω of resistance. For this purpose, when the electrode 15 is made of tungsten or molybdenum, its thickness needs to be not less than 8 μm.

FIG. 5 is a schematic view for illustrating an example of the structure of a heater unit into which the plasma generating electrode unit 14 of FIG. 4 is incorporated. In the embodiment of FIG. 5, the plasma generating electrode unit 14 is installed, via an arm 3, inside a chamber 1 to be exposed to a deposition gas or the like. At that time, the plasma generating electrode unit 14 is so installed that the plasma generating electrode 15 may be located near the upper face, and a wafer W is placed on the upper face of the plasma generating electrode unit 14. A pair of an electric power supply cables 21 and a high frequency signal supply cable 23 are arranged to communicate with the exterior of the chamber 1. In this state, electric power is supplied via a pair of the cables 21 for heating the resistance heating element 19, whereas a high frequency signal is supplied via the cable 23 for generating plasma at the electrode 15. Thus, heating and plasma generation can be effected. The plasma generating electrode unit is not limited to the above-mentioned embodiment only, but various modifications and variations are possible. For example, although in the above embodiment, the electrode 15 is used only as an electrode for the generation of plasma, this electrode 15 may be simultaneously operated as an electrostatic chuck electrode to chuck the wafer W based on electro-static capacity. For example, when the electrode 15 is simultaneously supplied with DC voltage for providing electrostatic capacity as well as with high frequency signals via an insulating transformer, the wafer W can be attracted onto the upper face of the plasma generating electrode unit 14 and plasma can be simultaneously generated. In order to supply the high frequency signals, at least four cables having a diameter of 10 mm are necessary when each cable is made of tungsten and has a resistance of not more than 1Ω. Thus, this largely differs from the case where the resistance may be 0 to several hundred Ω and the diameter of around 0.1 mm when the electrode 15 is used as the electromagnetic electrode only.

Figure 7:
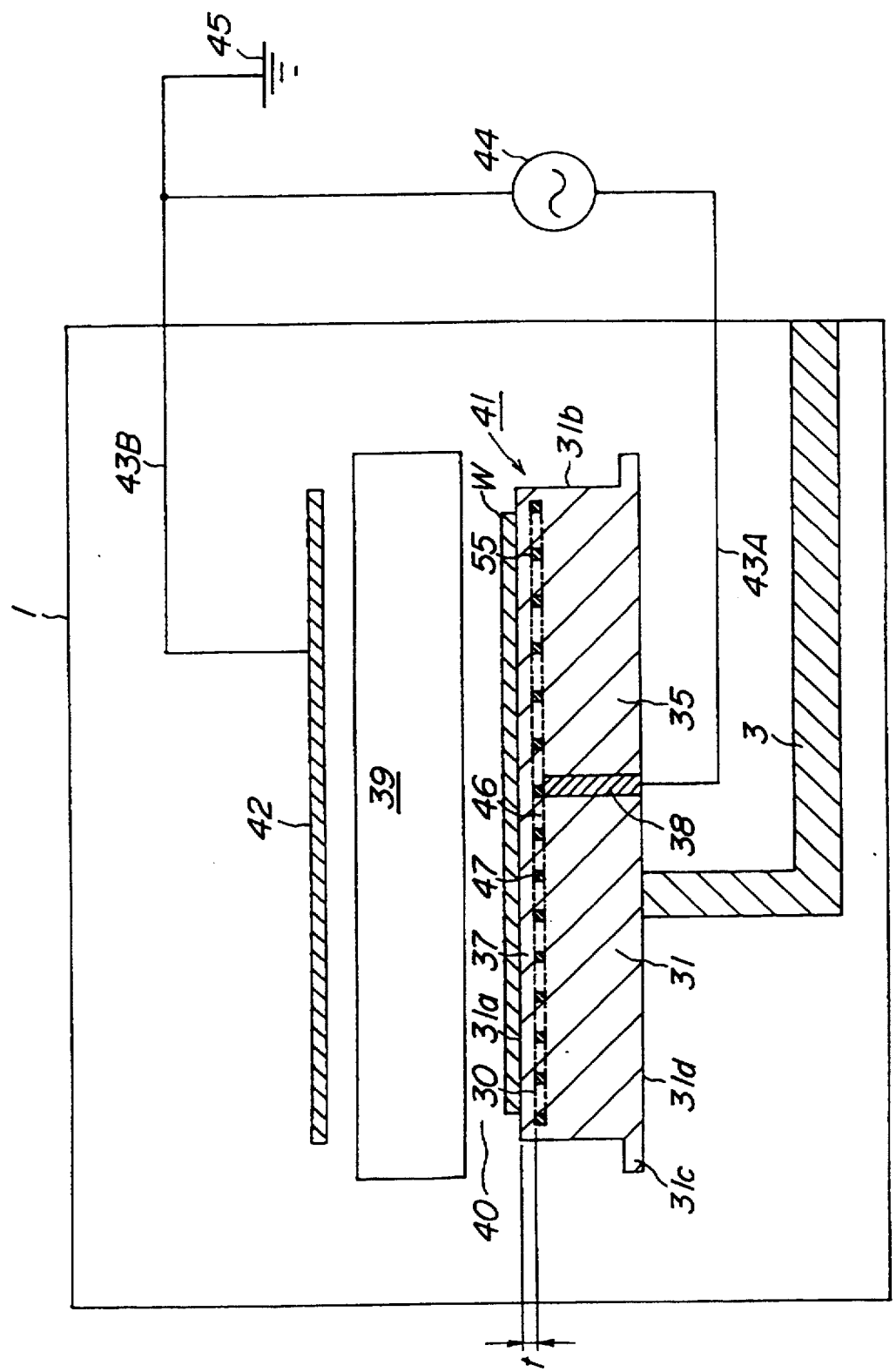
FIG. 7 is a partial cross sectional view for schematically illustrating how the plasma generating electrode device 41 according to the present invention is installed within a semiconductor device production unit.

FIG. 6 is a sectional view for outlining an electrostatic chuck. FIG. 7 is a partially sectional view for schematically illustrating the state that plasma generating electrode unit 41 is installed in the chamber 1. FIG. 8 is a partially cut perspective view for illustrating the electrostatic chuck of FIG. 6 or the plasma generating electrode unit 41 of FIG. 7. FIG. 9 is a perspective view of a metal mesh 30. FIG. 10(a) is a schematically sectional view for illustrating the molding step in the uniaxial press mold, FIG. 10(b) is a sectional view illustrating a molding 53, and FIG. 10(c) is a sectional view for outlining the electrostatic chuck or the plasma generating electrode unit. FIG. 11 is a sectional view for illustrating a molding prepared by the cold isostatic pressing.

In order to produce the electrostatic chuck 36 in FIG. 6 or the plasma generating electrode unit 41 in FIG. 7, a press molding machine shown in FIG. 10(a) is first prepared. A mold frame 49 is engaged with a lower mold 52 of the press molding machine. Ceramic powder is filled into an inner space 48 of the mold frame 49, and uniaxially press molded between the lower mold 52 and an upper mold not shown to obtain a pre-molded body 51A. Then, a metal mesh 30 is placed on the pre-molded body 51A. As shown in FIG. 9, the metal mesh 30 has a circular shape. In FIG. 9, 46 and 47 denote a mesh and a wire, respectively.

Next, ceramic powder 50 is filled on the metal mesh 30 to bury the metal mesh 30. The powder 50 is uniaxially press molded by the upper mold not shown, thereby producing the molding 53 shown in FIG. 10(b). In the molding 53, the metal mesh 30 is embedded between the pre-molded body 51A and a pre-molded body 51B. Then, this molding 53 is subjected to hot press sintering and a given polishing. Thereby, a main body of the electrostatic chuck 36 or the plasma generating electrode unit 41 is obtained as shown in FIG. 10(c).

In FIG. 10(c), a ring-shaped flange 31c is provided at a peripheral side face 31b of a substantially discoidal substrate 31, and an electrostatic chuck electrode 29 or a high frequency electrode 55 made of the metal mesh 30 is embedded inside the substrate 31. A dielectric layer 34 or an electromagnetic wave permeation layer 37 is formed in a given thickness on a side of a setting face 31a for an object to be fixed, such as a semiconductor wafer. A terminal 33 or 38 is buried on a side of a supporting portion 35, and is connected to the electrode 29 or 55. An end face of the terminal 33 or 38 is exposed through a rear face 31d of the substrate.

According to another process, the ceramic powder 50 is molded by the cold isostatic press to produce planar moldings 56A and 56B as shown in FIG. 11. Then, a metal mesh 30 is held between the moldings 56A and 56B, which are subjected to the hot press sintering as they are.

The electrostatic chuck 36 shown in FIGS. 6 and 10 was produced by the above process. First, powdery aluminum nitride containing 5% by weight of yttria was used as the ceramic powder 50. The powder was molded under pressure of 7 tons/cm$^2$ by the cold isostatic pressing, thereby producing two moldings 56A and 56B. The bulk density of each molding was 2.51 g/cm$^2$.

The metal mesh made of metallic molybdenum was prepared. The metal mesh 30 was a rolled product having a mesh size of 0.18 mm in diameter. This metal mesh was held between the moldings 56A and 56B, which was hot press sintered at 1900° C. under 200 kg/cm$^2$. Thereafter, the average thickness of the dielectric layer was adjusted to 300 µm on the average by machining. The thickness of the dielectric layer 34 actually measured 306±50 µm. Then, a hole was bored from the rear face by ultrasonic working, and terminal 33 was joined thereinto. In the substrate 31 at four locations were bored holes 32 into which are passed pins for supporting the semiconductor wafer.

This electrostatic chuck 36 was subjected to an operation test. An electric wire 27 was connected to the terminal 33, a stainless weight 26 was placed on the setting face 31a, and an electric wire (earth wire) was contacted with the stainless weight 26. The electric wires 27 were connected to a DC power source 28. The stainless weight 26 was connected to a load cell 25 for the measurement of a load. Voltage of 1 KV was applied to make the stepping motor 24 to pull up the stainless weight 26 connected to the load cell 25 in an arrow A direction. The attraction force was determined according to (a load when the load cell peeled—mass of the weight) /(sectional area of an attracted face of the weight). As a result, the attraction force was 50 g/cm$^2$.

The relative density of the substrate 31 was not less than 99.9%, and the minimum insulating resistance and the average insulating resistance were 10 KV/mm and 28 KV/mm, respectively, within a plane of 146 mm in diameter.

On the other hand, the conventional electrostatic chuck made of pressurelessly sintered aluminum nitride exhibited the bulk density of 99.0% at the maximum. The minimum insulating resistance and the average insulating resistance were 3 KV/mm and 15 KV/mm, respectively, within a plane of 150 mm in diameter.

In the semiconductor production unit shown in FIG. 7, the plasma generating electrode unit 41 is installed in the chamber 1 via the arm 3. At that time, the plasma generating electrode unit 41 is so installed that the high frequency electrode 55 may be located on the side of the upper face of the unit, and the wafer W is placed on the setting face 31a. One end of an electric power-supplying cable 43A is connected to the terminal 38, and the other end of the cable 43A is extended outside the chamber 1 and connected to a high frequency electric power source 44. An opposite electrode 42 is arranged at a location opposed in parallel to the high frequency electrode at a given interval. One end of the electric power-supplying cable 43B is connected to the opposite electrode 42, whereas the other end of the cable 43B is extended outside the chamber 1 and connected to the high frequency electric power source 44 and earth 45. In FIG. 7, "t" is the thickness of the electromagnetic wave permeation layer 37.

In this state, plasma can be generated in the plasma-generating area 39 above the wafer W by supplying the high frequency electric power through a pair of the cables 43A and 43B. At this time, a plasma sheath 40 is generated between the plasma generating area 39 and the setting face 31a.

FIG. 12(a) is a perspective view for illustrating a punched metal 64 to be effectively used as a high frequency electrode or an electrostatic chuck electrode. The punched metal 64 has a circular shape, and is formed with a number of round holes 64b in a grid pattern within a circular flat plate 64a.

FIG. 12(b) is a perspective view for illustrating a circular thin plate 65 to be effectively used as a high frequency electrode or an electrostatic chuck electrode. FIG. 12(c) is a plane view for illustrating a thin plate 66 to be effectively used as a high frequency electrode or an electrostatic chuck electrode. In the thin plate 66, totally six parallel straight slender cuts 66b, 66c are formed. Among them, three cuts 66b are opened on the lower side in FIG. 12(c), whereas the remaining three cuts 66c are opened on the upper side in FIG. 12(c). The cuts 66b and the cuts 66c are alternatively arranged. By employing such a configuration, a slender electrically conductive path is formed in the thin plate. Therefore, terminals 66a are connected to opposite ends 66 of the electrically conductive path, respectively.

Figure 13:
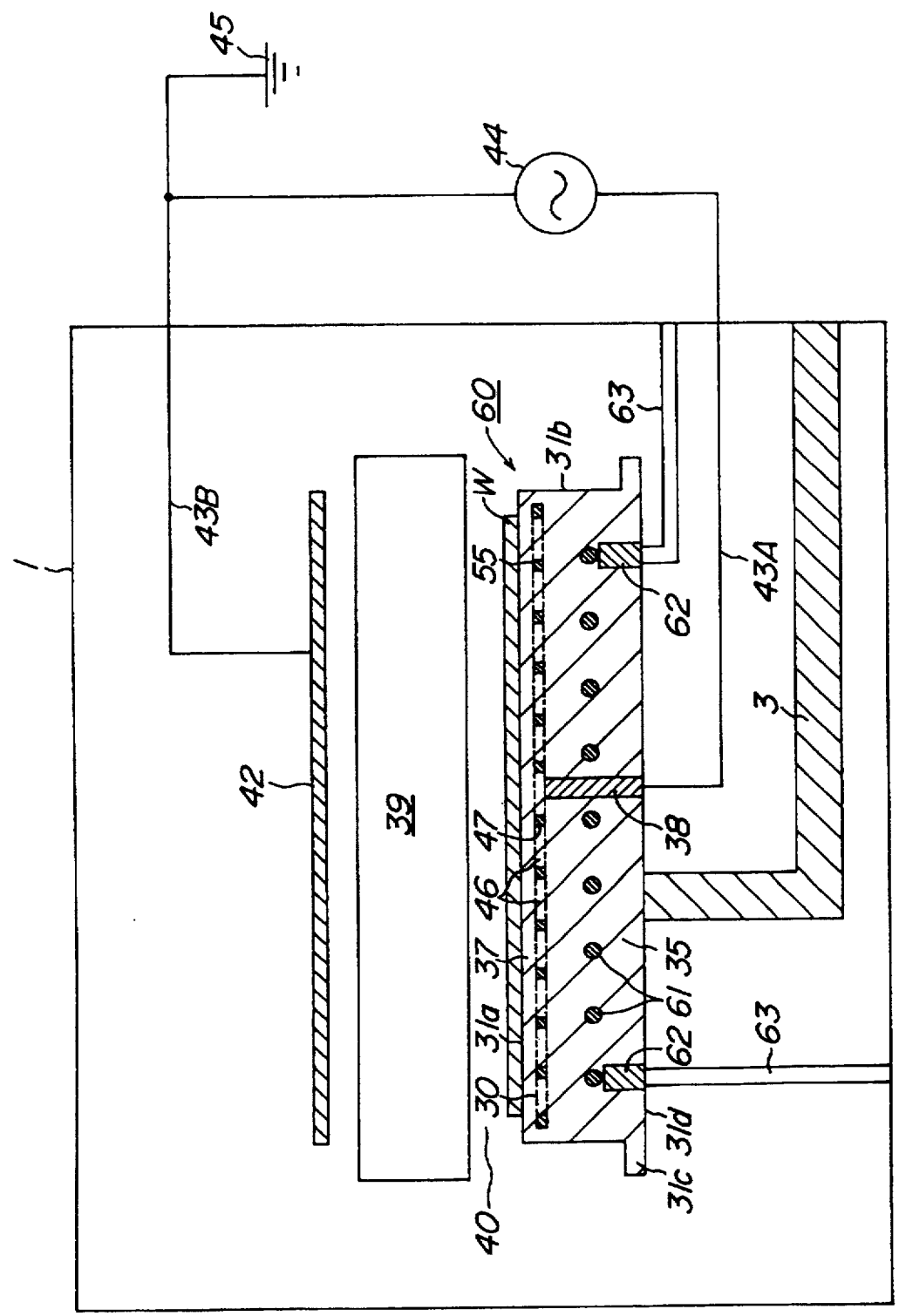
FIG. 13 is a partial cross section view for schematically typically illustrating how the plasma generating electrode device 60 according to a further embodiment of the present invention is installed within the semiconductor device production unit.

FIG. 13 is a partially sectional view for schematically illustrating the state in which a plasma generating electrode unit 60 according to another embodiment is installed in the chamber 1 in the same manner as in the embodiment of FIG. 7. Same reference numerals are given to the same constituent elements as shown in FIG. 7, and explanation thereon is omitted.

In the plasma generating electrode unit 60, a resistant heat generating body 61 made of a high melting point metal is embedded inside a supporting portion 35 of a substrate, that is, between the high frequency electrode 55 and the rear face 31d. Opposite ends of the resistance heat generating body 61 are connected to terminals 62, respectively, and each of them is buried in the substrate 31 and exposed to the rear face 31d of the substrate 31. One end of an electric power-supplying cable 63 is connected to respective one of the terminals 62, and the other of the cable 63 is extended outside the chamber 1 and connected to an electric power source not shown.

The resistance heat generating body is preferably constituted as a coil in which a wire or a strip is spirally coiled. The coil is embedded in a substantially spiral or swirling form as viewed in plane from the side of the rear face 31d or the setting face 31a. After the wafer W is placed at a given position, the wafer can be heated by supplying electric power to the resistive heat generating body 61 simultaneously with the generation of plasma.

In the following, more concrete experimental results will be described.

(Experiment 1)

A plasma generating electrode unit 41 as shown in FIGS. 7 to 10 was produced. First, powdery aluminum nitride containing 0.1% of metallic impurities other than aluminum was prepared as the ceramic powder 50. This powder was molded under pressure of 7 tons/cm$^2$ by the cold isostatic press, thereby producing two planar moldings 56A and 56B as shown in FIG. 11. The bulk density of each molding was 2.2 g/cm$^3$.

A metallic molybdenum mesh or mesh electrode 30 was prepared. The diameter of wires constituting the mesh electrode 30 was 0.35 mm with #24 (the number of crossing wires per one inch being 24) and the outer shape of 200 mm in diameter. This mesh electrode 30 was held between the moldings 56A and 56B, which were subjected to hot press sintering at 1900° C. under 200 kg/cm$^2$. By so doing, an aluminum nitride sintered body having the relative density of 99.4% was obtained.

When powdery aluminum nitride containing 5% of yttria was used in a similar example, aluminum nitride sintered bodies having the relative density of not less than 99% were obtained by any of the uniaxial press process and the hot press process.

Then, the surface of the substrate (a setting face 31a) was machined. At that time, while the thickness or the distance from the mesh electrode 30 to the surface at each planar location was being measured by a film thickness meter of an eddy current detecting system, the surface was machined. Thereby, the inclination of the mesh electrode 30 was coincident with that of the surface of the electromagnetic wave permeation layer 37 so that the center line of the mesh electrode 30 might not be inclined with respect to the surface of the electromagnetic wave permeation layer 37. Thereafter, a hole was bored in the substrate from the rear side 31d by ultrasonic wave working, and a terminal 38 was joined thereto. The plasma generating electrode unit 41 had the dimensions of 12 mm in thickness and 205 mm in diameter. As shown in Table 1, the average thickness, the fluctuation in thickness, and the minimum thickness of the electromagnetic wave permeation layers 37 were varied.

An 8-inch wafer was placed on the surface of each plasma generating electrode unit. Into the chamber 1 introduced $CF_4$ gas, and a gas feed system and a gas exhaust system were so controlled that the pressure might be controlled to 400 mmTorr. As the high frequency power source, those having frequencies of 13.56 MHz and 2 kW, respectively, were used. In order to stabilize the discharging state, a machining box was inserted between the electric power source and the high frequency electrode. The discharging state was evaluated according to three levels. Results thereof are shown in Table 1.

TABLE 1

| Test No. | Average thickness (mm) | Fluctuation (mm) | Max. thickness (mm) | Min. thickness (mm) | Judgment |
|---|---|---|---|---|---|
| 1 | 0.3 | 0.8 | 0.8 | 0.01 | X |
| 2 | 0.5 | 0.8 | 0.9 | 0.1 | ○ |
| 3 | 2 | 0.9 | 2.4 | 1.5 | ○ |
| 4 | 5 | 1.0 | 5.5 | 4.5 | ○ |
| 5 | 10 | 0.7 | 10.3 | 9.6 | △ |

In Test No. 1, the average thickness was 0.3 mm, but the mesh electrode 30 was undulated. Thus, the minimum thickness was 0.01 mm to deteriorate stability of the plasma sheath near a location having the minimum thickness in the plasma generating test. This is considered that electric charges passed at the surface of aluminum nitride underwent dielectric breakdown at a thin location for some reason, so that the surface potential could not be kept constant, thereby changing the sheath area. In Test No. 2, no problem occurred in the stability of the plasma sheath.

In Test No. 5 with the average thickness "t" of 10 mm, the brightness of plasma lowered, and the temperature of the electrode unit vigorously rose beyond 300° C. This is considered that the dielectric loss of aluminum nitride decreased the electric field intensity of the surface, and further caused the self heat generation of the aluminum nitride layer. Under this condition, no matter how well plasma is stabilized, the efficient of plasma power decreases and the temperature cannot be sufficiently controlled. Consequently, the semiconductor wafer may be thermally damaged.

(Experiment 2)

In the same manner as in Experiment 1, plasma generating electrode units were prepared, except that the wire diameter of the mesh electrode 30 and the number of wires per one inch were varied as shown in Table 2.

TABLE 2

| Test No. | Wire diameter (mm) | No. of wires/inch | Plasma stability | Durability |
|---|---|---|---|---|
| 2 | 0.35 | 30 | ○ | ○ |
| 6 | 0.05 | 200 | ○ | ○ |
| 7 | 0.1 | 120 | ○ | ○ |
| 8 | 0.2 | 120 | ○ | ○ |
| 9 | 0.2 | 30 | ○ | ○ |
| 10 | 0.35 | 80 | ○ | ○ |
| 11 | 0.35 | 15 | ○ | ○ |
| 12 | 0.5 | 8 | ○ | ○ |
| 13 | 0.8 | 8 | ○ | ○ |
| 14 | 1.0 | 5 | X | X |

The mesh generally has the properties that the greater the diameter of the wires, the smaller is the number of wires per one inch, whereas the smaller the diameter of the wires, the greater is the number of wires per one inch. Therefore, for example, a mesh having the wire diameter of 0.05 mm and the number of the wires per one inch being 5 cannot be produced. Thus, almost all the meshes which can be readily produced in the commercial base are recited in Table 2. With respect of each unit, plasma was generated and its stability was tested in the same manners as in Experiment 1. In each of the units of Test Nos. 2, 6 to 13, plasma could be stably generated. Thus, they were indicated as "○" in the item "Plasma stability" in Table 2. Further, it was observed that their substrates were not damaged even in 48 hour holding. Thus, they were indicated as "○" in the item "Durability" in Table 2.

In Test No. 14, the mesh having the wire diameter of 1.0 mm and the number of wires per one inch being 8 was used, but localization was seen in the plasma distribution, and the substrate was damaged after the lapse of 3.5 hours.

(Experiment 3)

$CF_4$ is a halogen-based corrosive gas which generates fluorine radical to etch or clean various materials. In Experiment 1, various properties of aluminum nitride constituting the electromagnetic wave permeation layer in Experiment 1 were measured. As a result, the dielectric loss tan δ was $0.6 \times 10^{-3}$ (1 MHz), and the thermal shock resistance $\Delta T$ was 250° C. Further, with respect to the sample in Test No. 2, the surface of the electromagnetic wave permeation layer was observed based on an EDAX chart and a scanning type electron micrograph. As a result, no change was observed in the EDAX chart between before and after the test. The scanning type electron micrograph seemed to reveal that aluminum fluoride was produced on the surface of the electromagnetic wave permeation layer after the test. Therefore, since corrosion with fluorine radicals was suppressed by a passivation film of $AlF_3$, the corrosion of the surface of the electromagnetic wave permeation layer was prevented. It was also confirmed that no particle was formed in the passivation film of $AlF_3$.

(Experiment 4)

With respect to Test No. 2 of the above Experiment 1, similar observations were effected in the same manners as in Experiment 3 except that the gas introduced into the semiconductor production unit was changed to $ClF_3$, $NF_3$, $Cl_2$, $SiH_2Cl_2$, or $CF_3$. In each case, results similar to those in Experiment 3 were obtained. Therefore, it was confirmed that the plasma generating electrode unit according to the present invention is general-purpose for various halogen-based corrosive gases.

Figure 14:
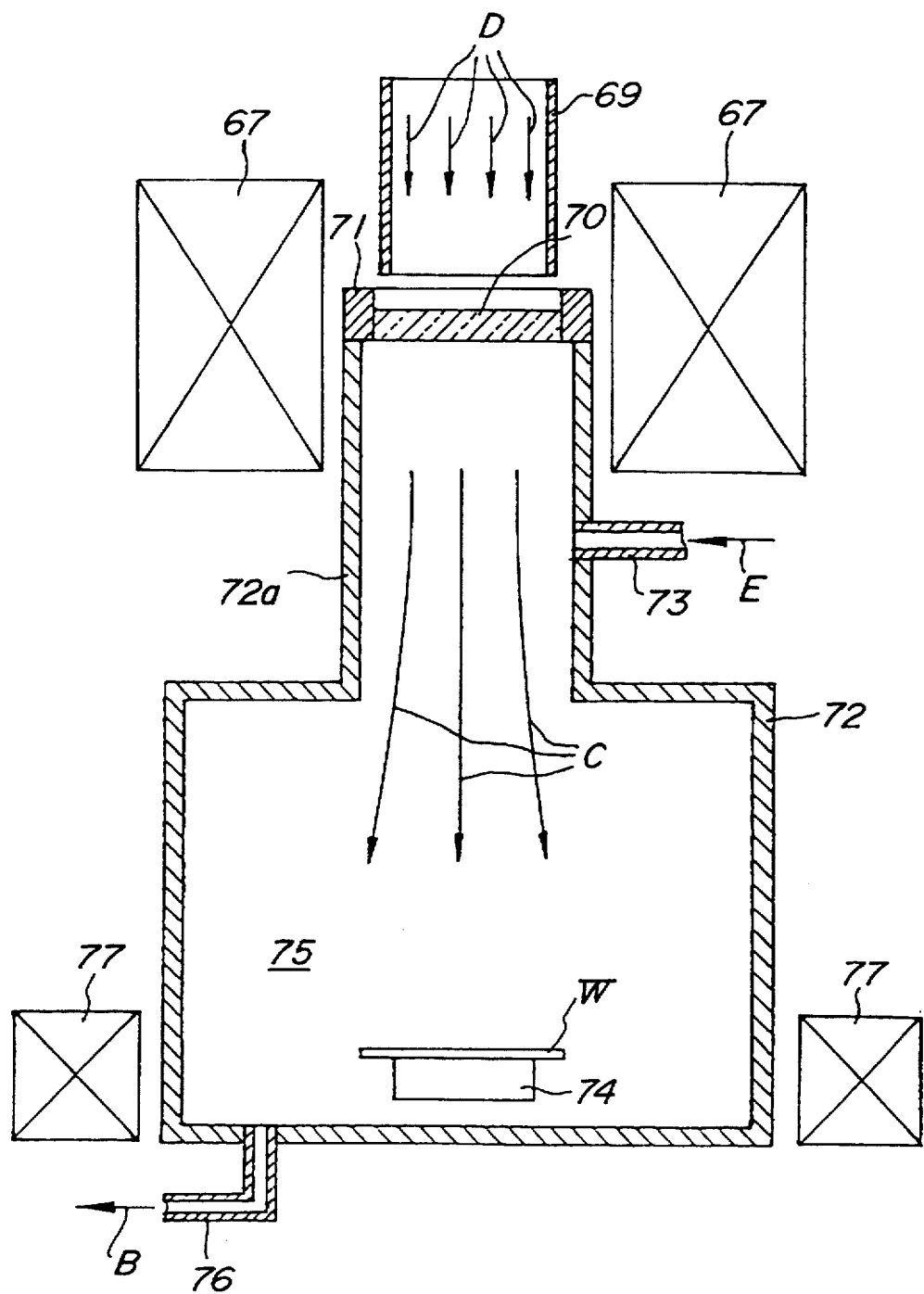
FIG. 14 is a schematic view for illustrating the concept of the construction of an electronic cyclotron resonance plasma generator to which the electromagnetic wave permeation body of the present invention is applicable.

FIG. 14 is a schematic view for illustrating the concept of an electron cyclotone resonance (ECR) apparatus. Microwaves (generally 2.45 GHz) are irradiated through a waveguide 69 in an arrow D direction, permeates an electromagnetic wave permeation window 70, and enters an inlet side portion 72a of chamber 72. A solenoid coil 67 is installed to surround the outer peripheral side of the inlet side portion 72a of the chamber 72. The coil 67 generates a magnetic field having an intensity of not less than 500 gauss.

A solenoid coil 77 is installed around the outer side of a processing chamber 75 of the chamber 72. The coil 77 spreads the magnetic field to constitute a reflecting magnetic field. Around the periphery of the electro-magnetic wave permeation window 70 is installed a water-cooling jacket 71 for preventing heating of a sealant which maintains the gas-tightness of the processing chamber 75, so the electromagnetic permeation window 70 is cooled. A gas is fed through a gas feed opening 73 provided at the inlet side portion 72 in an arrow E direction. The gas is discharged through a gas outlet 76 provided at an underside face of the chamber 72 in an arrow B direction.

When microwaves are irradiated into the chamber 72, high frequency voltage in a microwave region is applied to the gas so that plasma is generated in the high frequency electric field having a spatially non-uniform intensity distribution and the static magnetic field. The reflecting magnetic field applies downward force upon the generated plasma, so that the plasma is accelerated downwardly in an arrow C direction.

A susceptor 74 is installed in a lower portion of the processing chamber 75, and a wafer W is placed and held on the susceptor 74. The pressure inside of the chamber 72 is kept at a constant value.

By using this apparatus, an electromagnetic wave permeation window 70 was made of aluminum nitride having the above-mentioned properties according to the present invention. As Comparative Example 1, an electromagnetic wave permeation window 70 was made of quartz. As Comparative Example 2, an electromagnetic wave permeation window 70 was made of $Al_2O_3$. Properties of each material are shown below.

TABLE 3

Properties of aluminum nitride

| 4-point bending strength | 400 MPa |
|---|---|
| Weibull coefficient | 14 |
| Thermal conductivity | 150 W/m · K (measured at room temperature) |
| Specific heat | 0.18 (measured at room temperature) |
| Thermal impact resistance ΔTC | 500° C. |
| Dielectric constant ε | 8.6 (at room temperature, 10 MHz) |
| Dielectric constant ε | 8.8 (at room temperature, 1 MHz) |
| Dielectric loss tan δ | (3.50–3.90) × $10^{-3}$ (at room temperature 10 GHz) |
| Dielectric loss tan δ | 2.5 × $10^{-3}$ (at room temperature 1 MHz) |
| Visible radiation transmittivity | 3% t = 0.75 mm |

TABLE 4

Properties of quartz

| Thermal impact resistance ΔTc | 1000° C. (provided, a wave transmission loss occurs at 1200° C.) |
|---|---|
| Dielectric constant ε | 3.5–3.7 (at room temperature, 1 MHz) |
| Dielectric loss tan δ | 1.5 × $10^{-4}$ (at room temperature, 1 MHz) |
| Visible radiation transmittivity | 98%, t = 0.75 mm |
| Properties of $Al_2O_3$ | |
| Thermal impact resistance ΔTc | 190–200° C. |
| Dielectric constant ε | 10.6 (at room temperature, 1 MHz) |
| Dielectric loss tan δ | 1.1–2.9 × $10^{-3}$ (at room temperature, 1 MHz) |
| Visible radiation transmittivity | 95–96%, t = 0.75 mm |

The pressure inside the chamber 72 was held at 0.5 mTorr. As an etching gas, $CF_4$ was fed, activated in the plasma, and fed onto the wafer W. The semiconductor wafer W having the dimension of 8 inches in diameter was used. As the semiconductor becomes greater, the dimension of the electromagnetic wave permeation window 70 needs to be increased. For this reason, the dimension of the electromagnetic wave permeation window 70 was set at a diameter of 230 mm.

The susceptor 74 was made of aluminum nitride having the above properties. The reason why aluminum nitride was used as the material is that the material of the susceptor is required to not interrupt the magnetic fields of the coils 67 and 77 and to not change the flow of the microwaves.

With respect to each case, etching was effected, and the surface state after the etching was observed visually, EDAX, a scanning type electron micrograph. As a result, it was confirmed that the electromagnetic wave permeation window 70 was free from damage or permeation loss with the ECR plasma. That is, the surface was not melted with the ECR plasma.

Further, $CF_4$ generates fluorine radicals, which etches or clean various materials. However, no change was observed in Example between before and after the test. The scanning type electron micrograph seemed to reveal that aluminum fluoride was produced on the surface of the electromagnetic wave permeation window. Therefore, since corrosion with fluorine radicals was suppressed by a passivation film of $AlF_3$, the corrosion of the surface of the electromagnetic wave permeation window was prevented. It was also confirmed that no particle was formed in the passivation film of $AlF_3$.

Since aluminum nitride constituting the electromagnetic wave permeation window 70 has high strength (>350 MPa) and high thermal shock resistance (Tc>400° C.), rise in the temperature following absorption of the microwaves caused no damage.

AlN shown in Table 3 is one sintered by hot pressing with addition of $Y_2O_3$, and has high strength. Other AlNs were also tested. For example, with respect to an electromagnetic wave permeation window made of AlN with no addition of $Y_2O_3$ and having the properties of strength of 250 MPa, heat conductivity of 50 W/mK, thermal shock resistance ΔTc =300° C., it was confirmed that neither damage nor melting occurred as in the above case.

During the generation of plasma, the surface temperature of the electromagnetic wave permeation window reached about 250° C.

If ΔTc>300° C., no practical problem occurs. The electromagnetic wave permeation body made of aluminum nitride can be produced itself by a sintering process, a chemical gas phase growing process, or a physical gas phase growing process. When the temperature of the electromagnetic wave permeation window is 250° C., the dielectric loss is sufficiently low.

On the other hand, the electromagnetic wave permeation window 70 was made of quartz, and this electromagnetic wave permeation window 70 was damaged with the ECR plasma. Microscopically, the surface was melted with the ECR plasma. Further, the scanning type electron micrograph revealed that the surface of the electromagnetic wave permeation window 2 was corroded, and that its surface got rough.

In Comparative Example 2, the electromagnetic wave permeation window 70 was made of $Al_2O_3$, which was broken due to rise in temperature following the adsorption of the microwaves.

Next, in the example above mentioned polysilicon was etched by using $ClF_3$, $NF_3$, $Cl_2$, $SiH_2Cl_2$, or $CF_3$. The electromagnetic wave permeation windows 2 were free from abnormality. In this way, it was clarified that the present invention is general-purpose for ECRs using various halogen-based corrosive gases.

Further, in above Examples and Comparative Example 1, polysilicon was etched with use of Ar. As a result, neither damage nor permeation loss occurred. Microscopically, the surface was melted with the ECR plasma.

Further, in the above Examples, polysilicon was etched by using $O_2$ or $N_2$. As a result, neither damage nor permeation loss occurred. That is, the surface was not melted with the ECR plasma. In this way, it was clarified that the present invention exhibits durability against ECRs using various inert gases or halogen-based corrosive gases.

In the embodiment shown in FIG. 14, the ECR etching apparatus of a non-bias type was shown. However, in order to apply AC bias, an electrode can be provided inside the susceptor 74 to apply high frequency electric power.

Further, according to the present invention, besides the electromagnetic wave permeation body, a cover for an electrostatic capacity analyzer may be made of aluminum nitride so as to measure the velocity of ions in the ECR plasma. Further, a tube to be installed in a location for installing a helicon plasma antenna may be made of aluminum nitride.

The frequency range of the electromagnetic waves permeating the electromagnetic wave permeation body according to the present invention is not more than 300 GHz. Among the frequency range, the magnetic wave permeation body according to the present invention finds its particularly useful application as microwave permeation bodies. The frequency range of the microwaves is 300 MHz to 300 GHz. However, since the properties of aluminum nitride in the range of 1 MHz differ from those at 10 GHz, the above effects can be exhibited even in the frequency range of 1 MHz to 300 MHz. However, as the frequency increases, a material having a smaller dielectric loss tan δ is preferred.

What is claimed is:

1. A plasma generating electrode device, comprising:
a joint-free monolithic substrate made of a dense ceramic sinter; and a planar plasma electrode comprising bulk metal embedded in said substrate, said electrode being isolated from a setting face of the substrate and arranged to generate plasma above the substrate.

2. The plasma generating electrode device set forth in claim 1, wherein a resistance heating body made of a metal having a high melting point is embedded in the substrate, said plasma generating electrode device being constituted such a that surface of the substrate on a plasma-generating side is heated by feeding electric power to the resistance heating body.

3. The plasma generating electrode device set forth in claim 1, wherein a volume resistivity of an electromagnetic wave permeation layer existing between said electrode and that surface of the substrate on a plasma-generating side is not less than $10^8$ Ωcm, and a resistance of said electrode is not more than 1Ω.

4. The plasma generating electrode device set forth in claim 1, wherein a wafer is attracted onto said setting face by generating an electrostatic capacity by applying a DC voltage to said electrode, and plasma is generated by feeding high frequency signals to said electrodes via an insulating transformer.

5. The plasma generating electrode device set forth in claim 1, wherein the average thickness of the electromagnetic wave permeation layer is at least 0.1 mm.

6. The plasma generating electrode device set forth in claim 5, wherein the average thickness of the electromagnetic wave permeation layer is at least 0.5 mm.

7. The plasma generating electrode device set forth in claim 5, wherein the average thickness of the electromagnetic wave permeation layer is at least 5 mm.

8. The plasma generating electrode device set forth in claim 1, wherein said electrode has a plate-shaped body having a plurality of small holes.

9. The plasma generating electrode device set forth in claim 8, wherein said electrode is a mesh electrode, the width of wires of said mesh electrode is not more than 0.8 mm, and the number of crossing wires per one inch is not less than 8.

10. The plasma generating electrode device set forth in claim 1, wherein the thickness of said electrode is not less than 20 μm.

11. The plasma generating electrode device set forth in claim 5, in combination with a semiconductor production unit using a halogen-based corrosive gas, said plasma generating electrode device being adapted to be used to generate plasma of said halogen-based corrosive gas by applying high frequency voltage upon the halogen-based corrosive gas.

12. The plasma generating electrode device set forth in claim 5, wherein said substrate is made of a nitride-based ceramic.

13. The plasma generating electrode device set forth in claim 12, wherein at least said electromagnetic wave permeation layer of the substrate is made of aluminum nitride, said aluminum nitride having a dielectric loss tan δ of not more than $10^{-1}$, and a thermal shock resistance ΔTc of not less than 250° C.

14. The plasma generating electrode device set forth in claim 12, wherein the content of impurities in said aluminum nitride is not more than 1%, and a relative density thereof is not less than 99%.

15. An electrode-embedded article comprising a joint-free monolithic substrate made of a dense ceramic sinter, and a plasma-generating electrode embedded in said substrate and made of a planar metal bulk, said substrate surrounding said electrode being free from a joint face.

16. The electrode-embedded article set forth in claim 15, in combination with a semiconductor production unit using a halogen-based corrosive gas.

17. The electrode-embedded article set forth in claim 15, in combination with a semiconductor production unit, and wherein said electrode comprises a metal having a high melting point, said metal being selected from the group consisting of tantalum, tungsten, molybdenum, platinum and alloys thereof.

18. The electrode-embedded article set forth in claim 15, wherein said electrode is a planar electrode made of a plane body having a plurality of small holes.

19. The electrode-embedded article set forth in claim 18, wherein said electrode is a mesh electrode.

20. A process for producing an electrode-embedded article, comprising the step of hot press sintering a ceramic molding and a plasma-generating electrode made of a planar metal bulk under pressure applied in a thickness direction of said electrode, thereby embedding said electrode in a dense substrate made of a monolithic sinter free from a joint face.

21. The process for producing the electrode-embedded article set forth in claim 20, wherein said ceramic molding in which said electrode is embedded is obtained by the steps of producing a preliminary molding, placing said electrode on said preliminary molding, applying a ceramic powder on said preliminary molding and said electrode, and uniaxially molding the resultant.

22. The process for producing the electrode-embedded article set forth in claim 20, wherein two moldings having a relative density of 60% are produced, said electrode is sandwiched between said two planar moldings, and said two planar moldings and said electrode are hot pressed in this state.

23. The process for producing the electrode-embedded article set forth in claim 22, wherein powdery aluminum nitride having the content of not more than 1% of metallic impurities is used as said ceramic powder, and said substrate having a relative density of not less than 99% is obtained.

24. An electromagnetic wave permeation body for use in a plasma-generating device for generating plasma to a gas, comprising: a susceptor comprising a joint-free monolithic substrate made of a dense ceramic sinter; and a planar plasma electrode comprising bulk metal embedded in said substrate, wherein at least that surface of said electromagnetic wave permeation body which is to contact an atmosphere in which plasma is generated comprises aluminum nitride, said aluminum nitride having a dielectric loss, tan $\delta$, of not more than $10^{-2}$ and a thermal shock resistance $\Delta T$ of not less than 300° C.

25. The electromagnetic wave permeation body set forth in claim 24, wherein plasma of a halogen-based corrosive gas is generated upon application of the high frequency electric power upon said gas.

26. The electromagnetic wave permeation body set forth in claim 25, wherein said halogen-based corrosive gas is at least one kind of a halogen-based corrosive gas selected from the group consisting of $CF_4$, $ClF_3$, $NF_3$, $Cl_2$, $SiH_2Cl_2$ and $CF_3$.

27. The electromagnetic wave permeation body set forth in claim 25, wherein a passivation film made of aluminum fluoride is formed on a surface of said electromagnetic wave permeation body.

28. A plasma generating electrode device, comprising:

a joint-free monolithic substrate made of a dense ceramic sinter;

a resistance heating body embedded in said substrate; and a planar plasma-generating electrode comprising bulk metal embedded in said substrate between said resistance heating body and a setting face of said substrate, said electrode being isolated from the setting face of the substrate and arranged to generate plasma above the substrate.

* * * * *

UNITED STATES PATENT AND TRADEMARK OFFICE
CERTIFICATE OF CORRECTION

PATENT NO. : 5,800,618
DATED : September 1, 1998
INVENTOR(S) : Yusuke NIROI; Koichi UMEMOTO; and Ryusuke USHIKOSHI It is certified that error appears in the above-identified patent and that said Letters Patent is hereby corrected as shown below:

On the title page, item [30], line 2, change "5-289290" to --5-289230--.

Signed and Sealed this

Twenty-second Day of December, 1998

Attest:

BRUCE LEHMAN

Attesting Officer

Commissioner of Patents and Trademarks